US009017573B2

(12) United States Patent
Risser et al.

(10) Patent No.: US 9,017,573 B2
(45) Date of Patent: Apr. 28, 2015

(54) ORGANIC-INORGANIC COMPLEXES CONTAINING A LUMINESCENT RARE EARTH-METAL NANOCLUSTER AND AN ANTENNA LIGAND, LUMINESCENT ARTICLES, AND METHODS OF MAKING LUMINESCENT COMPOSITIONS

(75) Inventors: Steven M. Risser, Reynoldsburg, OH (US); Vincent McGinniss, Sunbury, OH (US); David W. Nippa, Dublin, OH (US); Paul Edward Burrows, Chattaroy, WA (US); Asanga B. Padmaperuma, Richland, WA (US); Sambhu N. Kundu, Richland, WA (US); Hiroshi Mataki, Shiga (JP)

(73) Assignee: Batlelle Japan Corporation, Tokyo (JP)

( * ) Notice: Subject to any disclaimer, the term of this patent is extended or adjusted under 35 U.S.C. 154(b) by 747 days.

(21) Appl. No.: 13/060,038
(22) PCT Filed: Aug. 19, 2009
(86) PCT No.: PCT/US2009/054371
§ 371 (c)(1),
(2), (4) Date: Jun. 15, 2011
(87) PCT Pub. No.: WO2010/022191
PCT Pub. Date: Feb. 25, 2010

(65) Prior Publication Data
US 2011/0232752 A1   Sep. 29, 2011

Related U.S. Application Data

(60) Provisional application No. 61/090,191, filed on Aug. 19, 2008, provisional application No. 61/184,197, filed on Jun. 4, 2009, provisional application No. 61/145,515, filed on Jan. 16, 2009.

(51) Int. Cl.
*C09K 11/06* (2006.01)
*C07F 5/06* (2006.01)
(Continued)

(52) U.S. Cl.
CPC .............. *C09K 11/06* (2013.01); *C09K 11/7728* (2013.01); *C09K 11/771* (2013.01);
(Continued)

(58) Field of Classification Search
CPC .. C09K 11/025; C09K 11/06; C09K 11/7701; C09K 11/7706–11/7709; C09K 11/771; C09K 11/7713; C09K 11/7714; C09K 11/7728; C09K 11/7734; C09K 221/1025; H01L 31/055
USPC .......... 252/301.16, 301.4 R, 301.4 S, 301.33, 252/301.4 P; 428/690; 427/157, 74, 65, 162, 427/164; 136/257, 256, 259, 247, 248
See application file for complete search history.

(56) References Cited

U.S. PATENT DOCUMENTS

| | | | |
|---|---|---|---|
| 6,723,454 | B2 | 4/2004 | Verhoeven et al. |
| 7,205,048 | B2 * | 4/2007 | Naasani ........................ 428/403 |

(Continued)

FOREIGN PATENT DOCUMENTS

| | | | |
|---|---|---|---|
| EP | 1923449 | * | 5/2008 |
| JP | 05-088026 | | 4/1993 |

(Continued)

OTHER PUBLICATIONS

English translation of WO 2006/004187 A1 (KRI INC [JP]; Mataki Hiroshi [JP]; Fukui Toshimi {JP]) Jan. 12, 2006.*

(Continued)

*Primary Examiner* — Carol M Koslow
(74) *Attorney, Agent, or Firm* — Frank Rosenberg; C. Michael Gregenheimer; Todd Harrington

(57) ABSTRACT

Luminescent compositions are described comprising lanthanide-containing nanoclusters comprising lanthanide atoms bonded to at least one semimetal or transition metal via an oxygen or sulfur atom. Novel compositions include an antenna ligand complexed with the nanoclusters. The rare earth-metal nanoclusters are in the size range of 1 to 100 nm. Articles, such as solar cells, are described in which the nanoclusters (with or without antenna ligands) are dispersed in a polymer matrix. Novel methods of making luminescent films are also described.

13 Claims, 14 Drawing Sheets

Schematic illustration of Eu-Al nanocluster. (R: alkyl group)

(51) Int. Cl.
  *H01L 31/055*  (2014.01)
  *C09K 11/77*   (2006.01)
  *C09K 11/02*   (2006.01)
  *H01L 31/054*  (2014.01)

(52) U.S. Cl.
  CPC .......... *C09K11/025* (2013.01); *C09K 11/7734* (2013.01); *C09K 11/7714* (2013.01); *C09K 11/7713* (2013.01); *C09K 11/7701* (2013.01); *C09K 11/7707* (2013.01); *C09K 11/7706* (2013.01); *C09K 11/7708* (2013.01); *C09K 11/7709* (2013.01); *C09K 2211/1007* (2013.01); *C09K 2211/182* (2013.01); *C09K 2211/186* (2013.01); *H01L 31/055* (2013.01); *Y02E 10/52* (2013.01); *H01L 31/0547* (2014.12)

(56) References Cited

U.S. PATENT DOCUMENTS

| | | |
|---|---|---|
| 7,235,311 B2 | 6/2007 | Kathirgamanathan |
| 7,695,641 B2 * | 4/2010 | Mataki et al. ........... 252/301.4 F |
| 2008/0287583 A1 | 11/2008 | Mataki et al. |

FOREIGN PATENT DOCUMENTS

| | | |
|---|---|---|
| WO | 03/065394 | 8/2003 |
| WO | WO 2006/004187 | * 1/2006 |

OTHER PUBLICATIONS

Charbonnière et al., "Highly luminescent water-soluble lanthanide nanoparticles through surface coating sensitization," New J. Chem., 1055-1059, Feb. 2008.
"Bathochromicity of Michler's ketone upon coordination with lanthanide(III) β-diketonates enables efficient sensitisation of Eu3+ for luminescence under visible light excitation," Chem Comm. Werts et al, Mar. 15, 1999 799-800.
Office action in Japanese patent application No. 2011-523973, mailed Dec. 18, 2012.
Office action in Chinese patent application No. 200980139121.1, mailed Apr. 2, 2013.
Srivastava et al, "Phosphors," Interface 48-51 (2003).
"Rare earth phosphors: fundamentals and applications" J. Alloys and Compounds 275-277 (C.R. Ronda et al, 1998).
"Small singlet-triplet energy gap of acridone enables longer wavelength sensitisation of europium(III) luminescence" Dadabhoy et al, J. Chem. Soc., Perkin Trans. 2359-2360 (Nov. 15, 2000).
"Interactions between push-pull chromophores and lanthanide β-diketonates," Chapter 7 of Thesis of Werts (2000).
"Intramolecular Energy Transfer, the Fluorescence of Complexes of Europium" Weissman, J. Chem. Phys 214-217 (1941).
"Intramolecular Energy Transfer between Phenanthrene and Lanthanide Ions in Aqueous Micellar Solution" Darwent et al, J. Chem Soc, Faraday Trans. 873-880 (1993).
"New Sensitizer-Modified Calix[4]arenes Enabling Near-UV Excitation of Complexed Luminescent Lanthanide Ions" Steemers et al, J. Am. Chem. Soc. 9408-9414 (1995).
"Long wavelength sensitizers for europium (III) luminescence based on acridone derivatives," Dadabhoy et al, J. Chem. Soc., Perkin Trans. 348-357 (2002).
Van Deum et al., "Visible light sensitisation of europium(III) luminesence in a 9-hydroxyphenal-1-one complex," Chem. Comm. 590-592 (2005).
Yang et al., "A Highyl Luminescent Europium Complex Showing Visible-Light-Sensitized Red Emission: Direct Observation of the Singlet Pathway," Angew. Chem. Int. Ed. 5010-5013 (2004).
Wang et al., "First Oxadiazole-Functionalized Terbium(III) B-Diketonate for Organic Electroluminescence," J. Am. Chem. Soc., 6179-6180 (2001).
Li et al., "Mesostructured thin film with covalently grafted europium complex," New J. Chem., 674-676 (2002).
Tissue, "Synthesis and Luminescence of Lanthanide Ions in Nanoscale Insulating Hosts," Chem. Mater. 2837-2845 (1988).

* cited by examiner

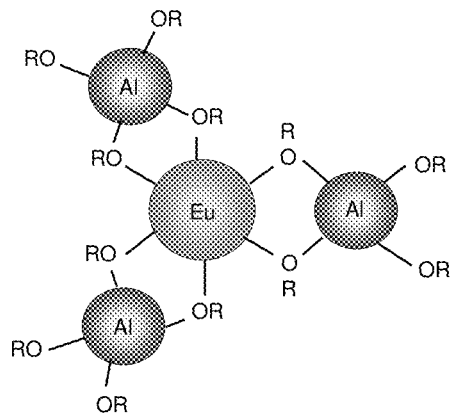
Fig. 1 Schematic illustration of Eu-Al nanocluster. (R: alkyl group)
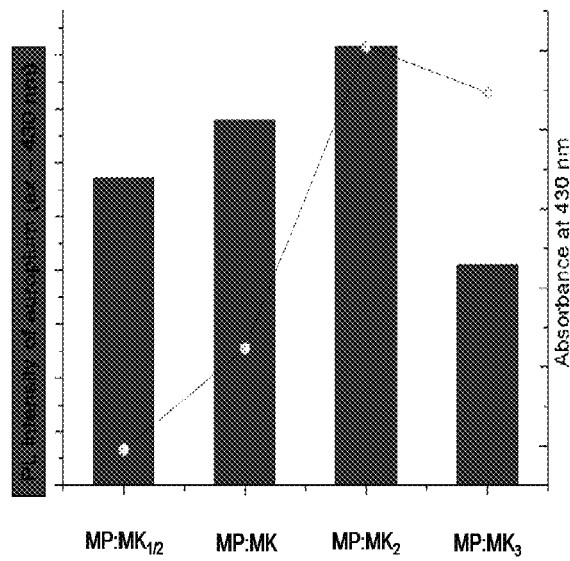
Fig. 6

ORGANIC-INORGANIC COMPLEXES CONTAINING A LUMINESCENT RARE EARTH-METAL NANOCLUSTER AND AN ANTENNA LIGAND, LUMINESCENT ARTICLES, AND METHODS OF MAKING LUMINESCENT COMPOSITIONS

RELATED APPLICATIONS

This application is a national stage filing of PCT/US2009/054371 and claims priority to U.S. Provisional Patent Application Ser. Nos. 61/090,191 filed 19 Aug. 2008, 61/145,515 filed 16 Jan. 2009, and 61/184,197 filed 4 Jun. 2009.

INTRODUCTION

The invention relates to novel luminescent compositions, methods of making luminescent articles, devices containing luminescent material, and methods of using luminescent articles. The invention also relates to a solar cell comprising a luminescent transparent component, which is placed in front of or in the back of a solar cell so that the solar cell detects either the luminescent light or the sunlight whose spectrum is modified.

There are two types of luminescent materials that have long been investigated: luminescent organic dyes, and rare earths materials.

Luminescent organic dyes have been the most commonly studied for luminescent concentrators and spectral converters. See Reisfeld, et al., U.S. Pat. No. 4,661,649. The luminescent organic dyes generally have high absorptivity and luminescent efficiency. However, they have several drawbacks which have prevented them from being used for practical field uses, including (1) degradation due to UV exposure, and (2) the reabsorption of the luminescence due to their overlapping absorption and emission bands. The degradation due to UV exposure is principally ascribed to the double bonds and aromatic rings, which are liable to be cleaved by high-energy light in the UV region. See R. W. Olsen, et al., "Luminescent solar concentrators and the reabsorption problem", Applied Optics, vol. 20, p. 2934 (1981).

Luminescent rare earth (RE) materials have also been examined. See Reisfeld, et al., U.S. Pat. No. 4,367,367. Rare earth ions such as erbium, dysprosium and europium are well known constituents of optoelectronic devices such as optical amplifiers, lasers and electroluminescent lamps. In general, they share the property that they can absorb energy from light at one or more wavelengths (the pump) and emit the absorbed energy at different wavelengths via spontaneous or stimulated emission. The emitted light is caused by the transition of excited electrons between atomic energy levels and has a very narrow spectral width. The absorption bands of these materials are also due to electronic transitions in the rare earth ion and are therefore similarly narrow. In many applications, such as lasers and optical amplifiers, the narrow width of the emitted light is advantageous and the narrow width of the absorption is not problematic since the rare earth is either pumped by a laser or, in the case of electroluminescence, by impact ionization from electrons excited by an external high frequency alternating electric field.

Because the luminescence of RE is induced by the electronic excitation and relaxation process of the RE ion itself, which is highly stable in nature, luminescence can be fundamentally free from the UV-induced degradation. Further, the Stokes shift of REs is generally large enough for avoiding the reabsorption problem. Nevertheless, REs have not yet been used successfully for the luminescent solar concentrators and spectral converters because of the low solubility of rare earth materials in most organic matrices, and low absorptivity, which results in low external quantum efficiency.

Rare earth elements can be doped into inorganic glasses and crystals. Inorganic glasses or crystals doped with rare earth materials can be mixed into polymers by breaking down the glasses or crystals into powders. However, the minimum particle diameter of such a powder is several $\mu m$ at the smallest, which is too large to suppress scattering loss due to Rayleigh scattering. This causes a fatal problem for luminescent transparent component used in solar cell modules.

It is known that rare earth materials can be dispersed in organic matrices at relatively high concentrations while keeping good transparency by forming an organic complex containing rare earth ion coordinated by organic molecules. In such a coordination structure, however, organic ligands having large vibrational energies could deactivate the energy state of rare earth ions excited by the incident sunlight, resulting in quenching generally referred to as multi-phonon relaxation. Also, as neighboring organic complexes containing rare earth ions get close at high concentrations, the excited energy state of a rare earth ion could be transferred to another rare earth ion, resulting in quenching generally referred to as concentration quenching.

Further, REs generally exhibit narrow-band emissions at specific wavelengths peculiar to each RE element. Because such wavelengths do not necessarily match with the spectral sensitivity of the band gap of solar cells such as single-crystalline Si, polycrystalline Si, Si micro crystals, and $Cu(In, Ga)Se_2$ (CIGS), it is desirable that the width and the range of the emission band can be controlled so that the emission band overlaps to as broad an extent as possible with the highly sensitive region of a solar cell.

One problem associated with rare earth-doped optoelectronic materials is that the concentration of rare earth ions cannot be increased beyond a low threshold due to concentration quenching effects. This requires the rare earth ions to be cast in a host matrix in a dilute dispersion. This problem has been ameliorated by the development of luminescent rare earth-metal nanoclusters shown in FIG. 1, which, with appropriate choice of R-group, can be cross-linked into a stable polymeric or co-polymeric matrix. See H. Mataki and T. Fukui, Jpn. J. Appl. Phys. 45, L380 (2006); and H. Mataki, K. Tsuchii, J. Sun, H. Taniguchi, K. Yamashita and K. Oe, Jpn. J. Appl. Phys. 46, L83 (2007). The compounds illustrated in FIG. 1 are described by Mataki and Fukui in WO 2006/004187 (which is incorporated herein by reference). In these particles, the rare earth ion is bonded to different atoms via bridging oxygen atoms. This has the effect of preventing concentration quenching even at relatively high loading of the rare earth ion (>5% by mass).

Some devices require a broad absorption band to function efficiently. A waveguide downconversion concentrator is one example of such a device. The narrow absorption band of rare earth phosphors is unsuitable for efficient use in such devices. The efficiency of absorption of a broad incident spectrum such as the solar spectrum is therefore low. This is a severe limitation in applications such as light emitting dopants in organic light emitting devices, where Forster transfer is used to transfer excitons from a host matrix to the light emitting dopant. Efficient Forster transfer can only be achieved when there is good overlap between the absorption spectrum of the dopant and the emission spectrum of the host, which is not possible to achieve with a broad emitting organic host and a narrow absorbing dopant. The limited absorption is also a problem in applications such as luminescent solar concentrators, since these devices rely on efficient absorption of the very broad solar spectrum. See W. H. Weber and J. Lambe, *Applied Optics* 15, 2299 (1976). If the absorption of the rare earth-metal nanoclusters could be dramatically broadened, they would be excellent candidates for such applications because the very narrow emission bandwidth could be efficiently matched to the bandgap of a semiconductor solar cell. A stack comprising more than one such material could convert the solar spectrum into a series of narrow emission peaks, each one matched to the bandgap of one of an array of semiconductor solar cells (e.g. Si, GaAs, InGaN etc.) By thus reducing the loss processes associated with hot carriers in such solar cells, the overall efficiency of conversion of the solar spectrum to electricity can be improved.

RE elements such as terbium (Tb) and europium (Eu) exhibit visible luminescent with relatively longer wavelengths, which is favorable for applying to LSC and spectral-conversion (SC) devices; however, with these materials the usable wavelength region of the incident sunlight in terms of excitation wavelength is virtually limited to the UV region less than 400 nm. Therefore, if one can use the sunlight in the region longer than 400 nm, the sunlight can be used more efficiently. Werts et al. found that the excitation band, whose edge is principally about 400 nm, can be extended to about 450 nm by adding 4,4'-bis(N,N-dimethylamino)-benzophenone, usually referred to as Michler's ketone. See M. H. Werts, et al., "Bathochromicity of Michler's ketone upon coordination with lanthanide(iii) b-diketonates enables efficient sensitisation of $Eu^{3+}$ for luminescence under visible light excitation", Chemical Communications, vol. 1999, 799 (1999); Verhoeven, et al., U.S. Pat. No. 6,723,454. Werts in "Making sense of lanthanide luminescence," *Science Progess*, 88, 101-131 (2005) states on page 118 that "The efficiency of energy transfer from the antenna to the ion is highly distance dependent." and "For optimal photosensitization the chromophore is preferably bound to the ion."

Numerous publications describe antenna ligands and their uses. For example, Ronson et al. in "Polynuclear lanthanide complexes of a series of bridging ligands containing two tridentate N,N',O-donor units: structures and luminescence properties," *Dalton Trans.*, pp. 1006-1022 (2007) describe various polynuclear lanthanide compounds that include antenna ligands. Luminescence measurements are reported.

There have been several publications that describe luminescent lanthanide complexes in sol-gel-derived glass or xerogels that include antenna ligands. For example, Reisfeld, "Rare earth complexes in sol-gel glasses," *Mater. Sci.*, pp. 5-18 (2002) describes luminescent properties of a Eu cryptate entrapped in a sol-gel xerogels of silica, zirconia and an organically modified zirconia-silica hybrid (the condensation product of zirconia tetrapropoxide and 3-glycidoxypropyltrimethoxysilane). Reisfeld remarked that "the antenna effect was observed in the Eu(III) cryptate in the solution and xerogel. The cryptate entrapped in the xerogel showed higher emission efficiency and longer lifetime than in solution." Thus, Reisfeld observed that "rare-earth organic complexes doped in sol-gel hosts are good candidates for phosphors." The films containing the europium complex in an organically modified xerogel had improved luminescence as compared to the complex in zirconia. Earlier reports of this work are described in Saraidarov et al., "Luminescent properties of silica and zirconia xerogels doped with europium(III) salts and europium(III) cryptate incorporating 3,3'-biisoquinoline-2,2'-dioxide," *Chem. Phys. Lett.* 330, pp 515-520 (2000); Czarnobaj et al., "Antenna Effect in an oxide xerogel," *Spectrochimica Acta Part A* 54, pp. 2183-2187 (1998). Li et al. in "Mesostructured thin film with covalently grafted europium complex," *New. J. Chem.*, 26, 674-676 (2002) disclose a europium complex in mesostructured and amorphous sol-gel silica films.

Tissue, "Synthesis and Luminesence of Lanthanide Ions in Nanoscale Insulating Hosts," *Chem. Mater.* 10, 2837-2845 (1998) presents a review of lanthanide oxide nanoparticles in matrices. This review does not mention any attempts to add antenna ligands to lanthanide nanoparticles. In the Summary section, Tissue states: "Adjusting the nanoparticle size or modifying the surfaces might make it possible to tailor the luminescent properties of dopant and host. On a speculative note, studying optically active nanostructures could lead to the discovery of new and unexpected optical phenomena due to unpredicted optical confinement or dynamic effects."

Charbonnière et al., in "Highly luminescent water-soluble lanthanide nanoparticles through surface coating sensitization," *New J. Chem.*, 2008, describe the reaction of water-soluble $La_{0.95}Eu_{0.05}F_3$.AEP (AEP=aminoethylphosphate) nanoparticles (NPs) with 6-carboxy-5' methyl-2,2'-bipyridine (bipyCOO$^-$) in water, resulting in an increase of more than two orders of magnitude of the europium centered emission upon excitation at 305 nm. The nanoparticles were about 200 nm in diameter. Nanoparticles coated by the bipyCOO$^-$ ligands were prepared by surface ligand exchange in water, isolated and characterized by infrared spectroscopy, transmission electron microscopy, energy dispersion X-ray analysis and dynamic light scattering. These analyses compared to those of the genuine NPs sample confirmed the partial replacement of AEP by bipyCOO$^-$, with retention of the original morphology of the particles. The authors reported that the photo-physical properties of the isolated $La_{0.95}Eu_{0.05}F_3$.bipyCOO$^-$ NPs were measured in water by absorption, steady-state and time-resolved luminescence spectroscopies and stated that the large increase of the luminescence of the NPs is due to a surface generated antenna effect where coated bipyCOO$^-$ moieties efficiently absorb light and transfer the energy to emitting europium atoms of the NPs. There was no description of smaller nanoparticles nor a synthetic method for producing smaller nanoparticles.

The use of a luminescent layer on a window to absorb solar radiation and emit radiation to a photocell at the border of a window is described in Weber et al., "Luminescent greenhouse collector for solar radiation," *Applied Optics*, pp. 2299-2300 (1976). The concept is also discussed in Batchelder, "The Luminescent Solar Concentrator," Cal Tech Doctoral Thesis (1982).

Battelle Memorial Institute holds numerous patents for chromophores in polymer hosts including: U.S. Pat. Nos. 6,610,219 and 7,138,549; and US patent publications 2006106262; and 2005040377, all of which are incorporated herein by reference.

Because RE-M nanoclusters can be uniformly dispersed in polymer hosts while maintaining the cluster sizes within 2-3 nm, excellent transparency can be achieved. Mataki et al. have successfully demonstrated optical amplification with an optical gain of 5.57 dB/cm using a PMMA (polymethylmethacrylate) waveguide doped with Eu—Al nanoclusters.

In a solar cell module, the luminescent transparent component converts a specific wavelength of specific wavelength range of the incident sunlight to another specific wavelength or specific wavelength range so that the spectrum of the incident sunlight is modified to better match with the spectral response of the solar cell, resulting in the improvement of the optical to electrical energy conversion efficiency of the solar cell. Such an improvement of the energy conversion efficiency of solar cells using a luminescent transparent component is expected to be a promising technology for the nextgeneration solar cells, usually referred to as Third Generation Solar Cells. See A. Luque, et al., "FULLSPECTRUM: a new PV wave making more efficient use of the solar spectrum", Solar Energy Materials & Solar Cells, vol. 87, p. 467 (2995).

When the solar cell is attached to the luminescent transparent component in the lateral direction of the incident sunlight, the luminescent transparent component is commonly known as luminescent solar concentrator, luminescent solar collector, or luminescent greenhouse collector. See Weber et al., "Luminescent greenhouse collector for solar radiation", Applied Optics, vol. 15, p. 2299 (1977); R. Chambers, U.S. Pat. No. 4,127,425

When a luminescent transparent component is attached to the solar cell in the parallel direction of the incident sunlight, on the other hand, the luminescent transparent component is commonly known as a spectral converter. In general, the spectral converter converts a specific wavelength or a specific wavelength range of the incident sunlight to another wavelength or wavelength range depending on the characteristics of the luminescent materials doped in the spectral converter. Specifically, however, when the wavelength of the incident sunlight is converted to the integral multiple of the original wavelength, it is referred to as a down-converter. When the wavelength of the incident sunlight is converted to wavelengths shorter than the original wavelength, it is specifically referred to as an up-converter. In the invention, the terminology of a spectral converter shall be used as that containing down-converters and up-converters as well. Strümpel, et al., "Modifying the solar spectrum to enhance silicon solar cell efficiency—A overview of available materials", Solar Energy Materials and Solar Cells, vol. 91, p. 238 (2007)

SUMMARY OF THE INVENTION

In a first aspect, the invention provides a composition comprising: a polymer matrix, rare earth-metal nanoclusters dispersed in the polymer, and antenna ligands disposed on the exterior of the rare earth-metal nanoclusters; wherein the rare earth-metal nanoclusters are in the size range of 1 to 100 nm and comprise lanthanide atoms bonded to at least one semimetal or transition metal via an oxygen or sulfur atom.

In another aspect, the invention provides a composition comprising: rare earth-metal nanoclusters and antenna ligands interacting with the rare earth-metal nanoclusters; wherein the rare earth-metal nanoclusters are in the size range of 1 to 100 nm (preferably 1 to 10 nm) and comprise lanthanide atoms bonded to at least one semimetal or transition metal via an oxygen or sulfur atom. Here, "interacting with the rare earth-metal nanoclusters" means possessing a broad absorption peak in the region of 375-450 nm PL spectrum. This peak can be identified in the PL spectrum by conventional curve-fitting (or deconvolution) techniques. The peak is at least about 25 nm wide at half height. An example is shown in FIG. 7.

Whether an antenna ligand is "disposed on the exterior of the rare earth-metal nanoclusters" can be determined by observing absorbance and emission, and by observing whether splitting occurs in the photoluminescence spectra (PL). For Eu, the presence of substantial splitting of the $^5D_0 \rightarrow {}^7F_4$ PL peak would indicate that the antenna ligand has moved into the interior of the rare earth-metal nanocluster. If PL is ambiguous, other known techniques could be used to confirm the presence of an antenna ligand on the exterior of the rare earth-metal nanoclusters.

In a further aspect, the invention provides a composition comprising: a polymer matrix, rare earth-metal nanoclusters dispersed in the polymer, and antenna ligands disposed on the exterior of the rare earth-metal nanoclusters; wherein the rare earth-metal nanoclusters are in the size range of 1 to 10 nm and comprise lanthanide atoms bonded to at least one semimetal or transition metal via an oxygen or sulfur atom.

Luminescent rare earth-metal nanocluster sizes in the range of about 1 to about 10 nm or less are a desirable range for superior results and this range also matches the size (2 to 3 nm) of the tested rare earth-metal nanoclusters. Compared to the large nanoparticles, rare earth-metal nanoclusters in this size range would have been expected to be less stable and more likely to have their structure disrupted by acidic antenna ligands. A further surprising result is that the Eu:Al (or the Eu:Al:bridging oxo) ratio does not substantially change after reaction with the antenna ligand. Eu here is representative of the lanthanides and could be any of the lanthanides or a combination thereof. In some preferred embodiments, the lanthanide:aluminum molar ratio (as measured by elemental analysis) is in the range of 0.25 to 0.40, more preferably 0.30 to 0.35, most preferably about 0.33.

In the inventive compositions, a "semimetal or transition metal" comprises a transition metal, Al, Si, P, Ge, Ga, In, Sn, Sb, or As. A preferred group of elements comprises Zr, Ti, Ga, Al, Si, P, Hf, V, Nb, Ta, and W, and combinations thereof. Another preferred group of elements comprises Zr, Ti, Ga, Al, V, Nb, Ta, and W, and combinations thereof. A "lanthanide atom" comprises any of the elements having atomic numbers 57-71.

The invention also includes optical devices comprising the inventive compositions. Devices can include but are not limited to: optoelectronic devices, an electro-optic modulator, a luminescent concentrator, a flat panel display, a backlight for a liquid crystal display, etc.

The invention also includes methods of making the inventive compositions, comprising: forming a layer comprising rare earth-metal nanoclusters dispersed in a polymer; and, after the layer is formed, and adding an antenna ligand that binds to the rare earth-metal nanoclusters to result in a material with enhanced luminosity. "Enhanced luminosity" means enhanced per lanthanum atom. In the above method of making a luminescent film by adding an antenna ligand to a preformed film, it is surprising that an antenna ligand could migrate through the polymer and complex with the rare earth-metal nanoclusters to enhance luminosity. The composition could alternatively be made by combining the antenna ligand with the rare earth-metal nanoclusters in solution prior to forming the layer. The invention further includes mixtures (such as a suspension and/or a precursor to forming a solid) of the rare earth-metal nanoclusters and antenna ligands in a liquid. The liquid could be an organic liquid. The invention includes a composition formed by combining the rare earth-metal nanoclusters, antenna ligand and polymer.

The invention also includes devices and/or compositions defined by certain measurable properties, as described in the specification. Composite materials can be chemically complex and it may not be possible to fully understand the precise chemical species present in the composite. Therefore, the composite materials can also be defined by measurable characteristics. Such characteristics can include: elemental analysis, NMR data, SEM, IR, absorption and emission, luminescence measurements, etc.

In another aspect, the invention provides a composition comprising: a rare earth-metal nanocluster and a cyclic olefin bonded to the rare earth-metal nanocluster; wherein the rare earth-metal nanocluster is in the size range of 0.5 to 1000 nm and comprises lanthanide atoms bonded to at least one semimetal or transition metal via an oxygen atom. Preferred rare earth-metal nanocluster sizes are in the range of 0.5 to 10 nm, preferably 1 to 10 nm. The composition may further comprise an antenna ligand. The invention also includes a method of making the material by reacting a composition with an olefin to form a composite comprising a rare earth-metal nanocluster dispersed in a COC.

In a further aspect, the invention provides a solar cell having a luminescent coating, comprising: (i) a coating on a solar cell; (ii) wherein the coating comprises an organic host material, and a luminescent rare earth-metal nanocluster in which one or more other kinds of metals are coordinated to at least one kind of rare earth metals via oxygen or sulfur, that is disposed in the host material. During operation, the coating modifies the wavelength of light that impacts the solar cell.

The invention also provides a solar cell having a luminescent coating, comprising: (i) a coating on a solar cell; (ii) wherein the coating comprises an organic host material, and a luminescent rare earth-metal nanocluster in which one or more other kinds of metals are coordinated to at least one kind of rare earth metals via oxygen or sulfur, that is disposed in the host material; and further comprising a sensitizer that is complexed with the luminescent rare earth-metal nanocluster. During operation, the coating modifies the wavelength of light that impacts the solar cell. In some preferred embodiments, the solar cell has a thickness more than 0.1 µm. In some embodiments, the film has a thickness of between 0.1 µm and 5 mm, preferably in the range of 50 µm to 2 mm. In preferred embodiments, the solar cell according to any of the above claims wherein the metal coordinated to a rare earth metal via oxygen or sulfur comprises one or more kinds of elements selected from Group 3B, Group 4A, and Group 5A metals. Also preferably, in the solar cell the metal that is coordinated to a rare earth metal or/and Period IV transition metal via oxygen or sulfur comprises one or more species of elements selected from aluminum, gallium, titanium, zirconium, hafnium, niobium, and tantalum. Preferably, the solar cell according to any of the above claims wherein the rare earth metal comprises one or more species of elements selected from terbium, europium, neodymium, ytterbium, erbium, and praseodymium.

In preferred embodiments, the sensitizer (antenna ligand) comprises aromatic rings and carbonyl groups; more preferably the sensitizer comprises one or more species of elements selected from 4,4'-bis(N,N-dimethylamino)-benzophenone, 4,4'-bis(N,N-diethylamino)-benzophenone, 4,4'-bis(N,N-dimethylamino)-thiobenzophenone. The bridging atom is preferably oxygen, but in some embodiments can be sulfur.

The invention also includes a composition comprising the rare earth-metal nanoclusters in an organic polymer, or a solar cell coated by the composition, in which the composition possesses diffuse luminosity ascribable to RE ion such that it exhibits a primary luminescence peak having a width at half height of at least 3 nm, preferably at least 5 nm, and in some embodiments, 7 to 14 nm (when exposed to simulated sunlight as reported in the Examples).

Examples of luminescent rare earth-metal nanoclusters with oxide bridging moieties are described by Mataki and Fukui in WO 2006/004187 (which is incorporated herein by reference). These examples are not intended to limit the invention. Other metals include a transition metal, Al, Si, P, Ge, Ga, In, Sn, Sb, or As. A preferred group of elements comprises Zr, Ti, Ga, Al, Si, P, Hf, V, Nb, Ta, and W, and combinations thereof. A rare earth metal comprises any of the elements having atomic numbers 57-71. Luminescent rare earth-metal nanocluster sizes in the range of about 1 to about 10 nm or less are a desirable range for superior results. Sensitizers, also known as antenna ligands, are materials that are known for enhancing luminosity of rare earth atoms.

In some specific embodiments, the polymer matrix comprises MMA or PMMA; however the invention is not limited to such polymers and is believed to have broad applicability to a wide variety of organic polymers.

The invention also includes solar cells comprising a spectral-conversion (SC) layer doped with RE-M nanoclusters and preferably modified by the presence of an antenna ligand. Preferably the layer further includes a polymer matrix. The invention also includes methods of capturing light and/or generating electricity comprising use of a SC layer doped with RE-M nanoclusters and modified by the presence of an antenna ligand, where the SC layer is used in combination with a solar cell. The SC layer can be present along with known components of a solar cell including (but not limited to) a silicon layer (in some embodiments amorphous silicon; in some embodiments a layer of n-type in contact with a layer of p-type), an antireflective layer, conductors connected to the photovoltaic material, a substrate, a covering layer, and encapsulation resin.

The invention also provides a luminescent transparent component for converting the solar spectrum in a solar cell module. The component is made of organic/inorganic nanocomposites doped with RE-M containing inorganic molecular clusters. The RE-M-containing molecular clusters give off luminescence of which either the emission band or the excitation band or both are wider than those peculiar to the RE ion. The nanocomposite may contain one or more sensitizers which transfer a part of the energy of the incident sunlight to the RE-M-containing molecular cluster. Such a component enables one to efficiently use the spectrum of the sunlight impinging onto a solar cell.

Alternative uses of the inventive compositions include as bio-technology applications such as bio-sensing and bio-imaging.

The inventive, antenna-ligated complexes have superior luminescence properties as compared with RE-M nanoclusters that are not complexed to antenna ligands. A polymer layer comprising the antenna-ligated complex was found to have a dramatically broadened absorbtion in the visible range. The invention also includes polymer films and optical devices that incorporate the antenna-ligated complexes. In various embodiments, the inventive compositions can be dispersed in polar or non-polar solvents or matrices; and the compositions exhibit enhanced luminescence properties even in polar environments. The invention also provides flexibilty in materials processing. A surprising advantage of some preferred embodiments of the invention is that superior absorption/luminescence properties are obtained while the antenna ligand is believed to be at distances greater than 3 Å, in some cases greater than 5 Å from the lanthanum atoms in the nanocluster.

GLOSSARY

Particle sizes and particle size distribution can be measured by optical and/or electron microscopy. Particle size distribution in a matrix can be measured by optical and/or electron microscopy taken of a cross-section of a composition. Particle sizes are measured along the longest observed particle axis. Particle size distribution is based on volume percent. Preferably, in a luminescent composition, more than 95 volume % of the RE-M nanoclusters are in the size range of 1 to 1000 nm; more preferably, at least 50 vol % of the RE-M nanoclusters are in the size range of 1 to 10 nm; more preferably at least 80 vol % of the RE-M nanoclusters are in the size range of 1 to 10 nm; and most preferably, at least 90 vol % of the RE-M nanoclusters are in the size range of 1 to 10 nm. In some preferred embodiments, the RE-M nanoclusters are essentially spherical (have an aspect ratio of 1.2 or less).

Antenna ligands can be any known antenna ligands which absorb light and subsequently transfer energy to a lanthanide atom. The antenna ligands include any of the antenna ligands described in the references mentioned herein (including the references mentioned in the Introduction). In some preferred embodiments, the invention can be defined in terms of selected antenna ligands. For example, the invention can be described as a comprising any combination of antenna ligands. As is known in the art, antenna ligands are organic ligands. For purposes of the present invention, "sensitizers" are synonymous with "antenna ligands." Antenna ligands produce the antenna effect.

The "antenna effect" is defined as the "intermolecular energy transfer process between an organic ligand and a luminescent metal ion." Bunzli, "Rare Earth Luminescent Centers in Organic and Biochemical Compounds" in G. Liu and B. Jacquier (Eds.), *Spectroscopic Properties of Rare Earths in Optical Materials*, (Springer, Heidlberg, 2005).

That antenna ligands are "complexed" with the RE-M nanoclusters does not necessarily mean that the ligands can be seen directly, but can be observed by techniques such as emission spectroscopy, NMR, or other appropriate analytical techniques. The composition with antenna ligands complexed with the RE-M nanoclusters will not have the characteristics of the sum of the antenna ligands plus the RE-M nanoclusters (each taken separately); rather, the complexation of the antenna ligands with the RE-M nanoclusters will have changed properties, for example, higher emission and/or adsorption, moved spectroscopic lines in NMR, IR, UV/vis spectroscopy, etc.

Comprising—as is typical in patent terminology, the term "comprising" means including and permits the presence of additional elements. Where "comprising" is used, it should be understood that, in alternate embodiments, the term "comprising" can be replaced by the narrower terms "consisting essentially of" or "consisting of."

Cyclic olefins are compounds that contain a ring made up of carbon atoms and contain at least one double bond that is not part of an aromatic bond.

Cyclic olefin copolymers (COC) are polymers formed from cyclic olefins polymerized with other unsaturated compounds. They are described by Shin et al. in an IUPAC report published in *Pure Appl. Chem.* 77, pp. 801-814 (2005), which can be looked to for the definition of the term as it applies to this invention.

Rare earth-metal (RE-M) nanoclusters are heterometallic molecular clusters comprising lanthanide atoms bonded to at least one transition metal or semimetal via an oxygen (or sulfur) atom and having a size (diameter) in the range of about 1 to about 1000 nm, preferably 1 to 100 nm, and in some embodiments, 1 to 10 nm. For nonspherical particles, diameter is the distance to the farthest spaced points on a particle as measured on a photomicrograph. It is believed that S can substitute for oxygen; however, in preferred embodiments, the bridging atom is oxygen. For purposes of this invention, "rare earth-metal nanoclusters" may sometimes be termed as simply nanoclusters.

"Polymer matrix" refers to any polymeric material in which RE-M nanoclusters are dispersed. The polymer matrix is organic (or organic-containing). The polymer matrix is not an inorganic glass such as $SiO_2$ or $TiO_2$. In some preferred embodiments, the elements C, H, N, and O comprise at least 90 mass %, preferably at least 98 mass %, of the polymer matrix. In some preferred embodiments, the polymer matrix is a thermoplastic. In some specific embodiments, the polymer matrix comprises MMA or PMMA; however the invention is not limited to such polymers and is believed to have broad applicability to a wide variety of organic polymers.

Dispersed in a matrix means that dispersed particles are observable by optical or electron microscopy.

BRIEF DESCRIPTION OF THE DRAWINGS

FIG. 1 is a schematic illustration of a rare earth-metal nanocluster. The R groups are organic moieties, typically an alkyl.

FIG. 6 shows absorbance at 430 nm and illustrates the effect of varying the molar ratio of antenna ligand (MK) to lanthanide (MP).

DESCRIPTION OF THE INVENTION

Figure 2:
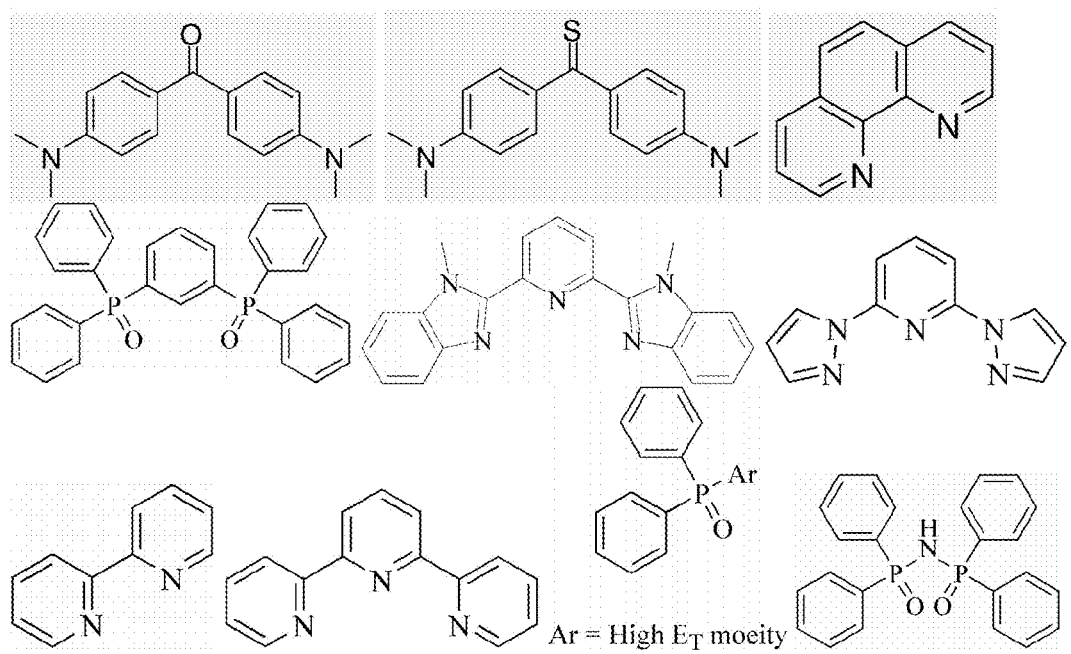
FIG. 2 illustrates some examples of antenna ligands.

The luminescent transparent component of the phosphor-polymer composite is made of organic/inorganic nanocomposites doped with RE-M nanoclusters, in which ligand molecules containing metal atoms are covalently bonded to the RE ion via inorganic elements such as oxygen and sulfur. The RE-M nanocluster may contain an organic group as a part of metal alkoxide. In this regard, such an RE-M nanocluster is significantly different either from RE-containing organic complexes or from inorganic phosphors which have conventionally been used as luminescent materials for LSC and SC.

The reason few studies have been made for the RE-M-containing heterometallic alkoxides may be because they have been regarded not to be particularly stable and more or less volatile. See Thompson, "Complexes" in *Handbook on the Physics and Chemistry of Rare Earth* (edited by K. A. Gschneidner, Jr. and L. Eyling) (North-Holland, 1979) p. 209.

Such instability is not appropriate when used in spectral converters and luminescent solar concentrators, whose temperature could significantly exceed the ambient temperature in the practical field. However, we found from thermal analysis that, once the Eu—Al-containing inorganic molecular cluster, for example, is incorporated into a polymer matrix such as polymethylmethacrylate (PMMA), the volatilization starts above about 300° C., while volatilization of Eu—Al nanocluster alone starts less than 100° C. In other words, a polymer doped with RE-M nanocluster is highly stable even at a temperature as high as about 300° C.

Further we found that the Eu-M nanocluster exhibits broad-band blue-green luminescence when selecting the coordinated metal (M) elements. When using aluminum (Al) as the coordinated metal element, for example, only narrow-band luminescence peculiar to Eu is observed. When using gallium (Ga), on the other hand, it emits luminescence corresponding to blue-green in addition to the narrow-band luminescence peculiar to Eu. It was found by Mataki et al., that a Tb-containing RE-M nanocluster exhibits a relatively broad luminescence that is ascribed to 4f-5d transition of Tb. See H. Mataki and T. Fukui, "Blue-Green Luminescence of Terbium ($Tb^{3+}$)-Titanium (Ti) Nanoclusters", Japanese Journal of Applied Physics, vol. 45, L380 (2006). However, the 4f-5d transition occurs with regard to limited rare earth elements such as $Ce^{3+}$ and $Tb^{3+}$, whose ionization potential is relatively smaller than the others. Mataki et al. disclosed in their article that Eu—Ti nanocluster does not exhibit a broad-band blue-green luminescence, while Tb—Ti nanocluster exhibits a broad-band blue-green luminescence. The mechanism of the blue-green emission of Eu-M nanoclusters is not known. However, such a luminescence spectrum control is useful for tuning the luminescence spectrum in the spectral efficiency peculiar to a desired solar cell material; for example, single-crystalline silicon, poly-crystalline silicon, micro-crystalline silicon, amorphous silicon, CIGS (cupper-indium-gallium-selenium), and dye-sensitized organic material.

The RE-M nanoclusters are in the size range of 1 to 100 nm and comprise lanthanide atoms bonded to at least one semi-metal or transition metal via an oxygen (or sulfur) atom. The nanocluster size is preferably in the range of 1 to 10 nm, in some embodiments in the range of about 2 to 5 nm. Oxygen is preferred over sulfur as the element bridging the lanthanide atoms and the semimetal or metal. In the RE-M nanocluster composition, a "semimetal or transition metal" comprises a transition metal, Al, Si, P, Ge, Ga, In, Sn, Sb, or As. A preferred group of elements comprises Zr, Ti, Ga, Al, Si, P, Hf, V, Nb, Ta, and W, and combinations thereof. Another preferred group of elements comprises Zr, Ti, Ga, Al, V, Nb, Ta, and W, and combinations thereof. A "lanthanide atom" comprises any of the elements having atomic numbers 57-71. Eu is one preferred lanthanide. Other preferred lanthanides include Tb, Dy, and Sm; however, the invention applies broadly to the lanthanides (RE elements). Preferably, A RE ion is bonded via at least 6 bridging oxygens to transition metal atoms (one such example is schematically illustrated in FIG. 1). The RE-M nanoclusters may have a single RE atom in each cluster, or may have 2 to 10, or more RE atoms in a RE-M nanocluster. The ratio of RE atoms to transition metal atoms is preferably 1:3. The bridging oxygens may be part of alkoxide groups, oxos, and combinations thereof. Likewise, the sulfur may be part of thiols. The outer part of the nanocluster preferably comprises alkoxy groups; preferably in a ratio of 1 to 3 alkoxy groups per transition metal or semimetal.

In addition to the RE-M nanocluster, we found that the excitation band can be broadened by adding a sensitizer such as Michler's ketone, resulting in a spectral sensitization. As used herein, the term "antenna ligand" includes compounds known as sensitizers. In the prior art, the extent to which the excitation edge can be extended is highly depending on the distance between Eu ion and Michler's ketone. Surprisingly, we found a significant effect in situations where the antenna ligand is far from the RE element. Molecular modeling reveals that Michler's ketone cannot come close to Eu due to the steric hindrance made by the bulky ligands of the RE-M nanocluster. Further, we demonstrated that such a spectral sensitization can be induced even by coating MMA doped with Michler's ketone subsequent to film formation. In this case, Michler's ketone diffuses into the PMMA matrix. It is unlikely however that Michler's ketone is directly coordinated to $Eu^{3+}$.

The organic/inorganic nanocomposite, whose inorganic dispersion phase is composed of RE-M nanoclusters, is especially useful for luminescent transparent components used in solar cells such as luminescent solar concentrators (LSC) and spectral converters. It is particularly effective to select the species of M elements so that resultant luminescence spectrum consisting of a narrow-band luminescence peculiar to the trivalent RE ion and a broad-band luminescence is tuned in the spectral sensitivity of a solar cell used. Also, it is particularly effective to add at least one kind of sensitizer so that the excitation of RE-M nanocluster is accomplished within a wavelength band broader than that ascribed only to the trivalent RE ion.

The basic technique and the new range of resulting materials are applicable to a wide variety of ligands. The antenna ligand (also called sensitizer) can be any antenna ligand known in the art for modifying the luminescence of REs. Several potential ligands, which may form a new ligated complex with the RE-M nanoclusters, each with different optical and optoelectronic properties, are shown in FIG. 2. Other molecules known in the literature to act as antenna ligands for lanthanum compounds, such as 2,4,6-trimethoxyphenyl dipicolinic acid, or Ruhemann's purple, are contemplated for use in this invention. The antenna ligand may include any of the antenna ligands mentioned in the references cited herein, any of the antenna ligands in FIG. 2 or tested in the examples. The invention may also use a combination of antenna ligands; although in some preferred embodiments only one type of antenna ligand may be present. In some preferred embodiments, the antenna ligand has one or more carbonyl groups, in some other preferred embodiments, the antenna ligand comprises two aromatic rings connected via a linking atom that is not part of the aromatic ring and that has a single bond to each of the aromatic rings; in some preferred embodiments the antenna group has both of these characteristics; these features have been discovered to correspond to unexpectedly superior luminescence results.

Examples of antenna molecules include: pyridine derivatives; e.g. bipyridine, terpyridine, pyridine dicarboxylic acids; triphenylene; quinolin and its derivatives; e.g. 3,3'-biisoquinoline-2,2'-dioxide; substituted phenyl and naphthyl groups; fluorescent organic dyes; e.g. fluorescein, tetra-bromoeosin, tris(8-hydroxyquinoline); tris(dibenzoylmethanate); lissamine; benzophenone and its derivatives, e.g. 4,4'-bis(N,N-dimethylamino)-benzophenone (MK), 4,4'-bis(N,N-diethylamino)-benzophenone, 4,4'-bis(N,N-dimethylamino)-thiobenzophenone; acetophenone and its derivatives, e.g. p-bromoacetophenone, p-chloroacetophenone; phenanthroline; p-hydroxyphenal-1-one; absorbent metal-containing complexes, e.g. ferrocene, diimine complexes of Pt(II), Re(I), Ru(II); acridone derivatives (less preferred); mono-thio-dibenzoylmethane; 2-hydroxyisophthalate; aza-compounds, e.g. diazabutadiene, azaxanthone, azathioxanthone; and dipyrazolyltriazine derivatives.

The polymers in the polymer matrices can be any desired polymer. Some preferred examples include: acrylic, polyesters, polyurethanes, silicones and combinations thereof. The carbon chain polymers can be silicone modified for extra durability.

We have discovered especially preferred polymer compositions that allow for the compatibilization or solubilization of luminescent RE-M nanoclusters that leads to excellent luminescent properties of the total polymer/phosphor formulation or system. These new polymer compositions also have special features that give good adhesion to glass and plastic substrates and also provide excellent durability characteristics for products made from these polymers and exposed to multiple outdoor stress environments. Polyacrylates are especially preferred. The composite materials generally contain 0.1 to 50 mass % luminescent RE-M nanoclusters, more preferably 0.5 to 30 mass %, in some embodiments preferably at least 5 mass %, in some embodiments 1 to 10 mass % and in some embodiments 5 to 10 mass % RE-M nanoclusters.

In various, nonlimiting embodiments, features of these new compositions may include: refractive index control (aromatic, aliphatic, fluorocarbon); special functional groups to control the solubility of the RE-M nanoclusters in the polymer (alcohol, acids, nitriles, esters); optical clarity enhancers; adhesion control functionality (silanes, acids, organometallics); a polymer solubility parameter range of 8-10 $(cal/cm3)^{1/2}$; thermoplastic or thermosetting polymer matrices; polymer matrices that are radiation-cured or thermally curable.

Figure 3:
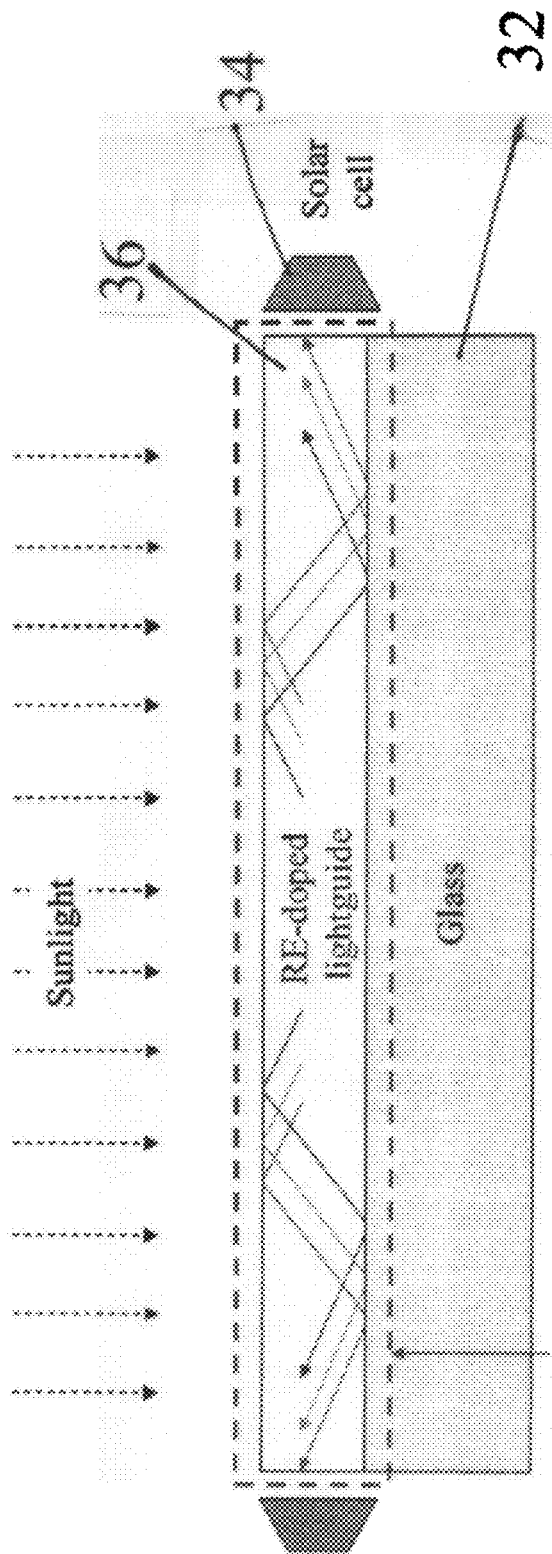
FIG. 3 illustrates an article comprising a lightguide and solar cells.

These polymer films can be used, for example, over a window (see the region indicated by the dotted line in FIG. 3). In this configuration, the antenna-ligated complexes absorb sunlight and emit light of in a narrow band of wavelengths that propagate along the plane of the window 32 and are captured by a photovoltaic cell (or cells) 34 that runs along one or more edges of the window. Optionally, the emitted light can be captured in an adjacent layer (a waveguide layer 36) for more efficient transmission to the photovoltaic cell. In this embodiment, the photovoltaic cell can have very high efficiency, as it can have its bandgap tuned to the energy of the narrow emission band. The window 32 can be a single layer of a polymer comprising the luminscent material or a laminate of plural layers that may, for example comprise a waveguide (where the waveguide comprises the luminescent material) disposed between two transparent sheets such as two sheets of a silica-based glass, with solar cells disposed at the edge of the waveguide layer. The thickness of the waveguide or other layer in the window is typically at least 50 times smaller than the length or width of the layer. In some preferred embodiments, the luminescent layer is disposed between a substrate and a waveguide, with the emitted radition being transmitted through the waveguide.

In some preferred embodiments, the inventive composition is in a layer or channel on a substrate. Preferably, the substrate material has an index of refraction (n) slightly greater than or equal to the luminescent layer to encourage light to propagate in the substrate layer. Thus the glass can act as a waveguide layer, allowing the emitted light to propagate in the lower loss glass medium. In some embodiments, the refractive index of the substrate, n, satisfies $1.53 \geq n \geq 1.50$. Some preferred substrates have $n \geq 1.500$, or $\geq 1.515$, or $\geq 1.52$.

Factors to be considered in designing a waveguide device include the following. The material preferably has a refractive index higher than that of the cladding layers to maintain guiding. However, the refractive index should be close to that of the optical waveguiding layer to minimize insertion loss. The material preferably maintains low optical loss at the carrier wavelength, which implies both low absorption by the RE-M nanoclusters and the polymer, and homogeneous dispersion of the RE-M nanoclusters throughout the polymer. The polymer is mostly or completely transparent at the operation wavelengths. The material is preferably soluble in a solvent which will not attack or swell the lower cladding. The material is preferably spin-coatable, and is preferably be etchable, should planarize across waveguides etched into the lower cladding, and/or is able to be photobleached to define the waveguide. The material is preferably insoluble in, and chemically stable to, a solvent for a top-cladding. The material (polymer with luminescent material) preferably has good adhesion to both the lower cladding and the top cladding to prevent delamination during thermal stress. The material preferably exhibits good water stability, to prevent the need for hermetic sealing. The material preferably is stable for brief periods at elevated temperature, such as 130° C. for 30 minutes. During this time, the chromophore should not aggregate. The material should be photostable at the operation wavelengths.

Samples were prepared of an inventive composition on glass plates with a size of 20 cm×20 cm, and optical power measurements for each of the samples when illuminated by a 405 nm laser source at a power of 14 dBm. The thicker samples produced increased optical output. Preferred thickness of the luminescent films are at least 1 μm thick, more preferably at least 30 μm thick, and in some embodiments the films have a thickness in the range of 0.1 mm to 3 mm.

Cyclic Olefin Modified RE-M Nanoclusters

Copolymers of ethylene and norbornene (or other cyclic olefin copolymers, COCs) are amorphous thermoplastics of high interest due to their unique combination of optical, mechanical, and processing properties. COCs are transparent to light with wavelengths above 300 nm and have a low birefringence. The glass transition temperature, $T_g$, is readily modified from 80° C. to 170° C. by increasing the norbornene content. They have very low water absorption (less than 0.01%) and exhibit high resistance against acids, bases, and polar organic solvents. They are readily processable by solution processing methods employing non-polar solvents and also by melt-processing methods such as injection molding and extrusion. COCs are commercially available under the tradename Topas™ by Ticona. Topas is currently used as an alternative for materials like polycarbonate and polymethyl methacrylate, as well as in biomedical and packaging applications.

The invention includes methods for incorporating rare earth-metal nanoclusters into polymers, preferably into COCs. Such materials can be useful for active polymer waveguide devices, as well as for molded optical components such as lenses, windows, etc.

Synthesis of Rare Earth-Metal-Modified Cyclic Olefin Copolymers

Figure 4:
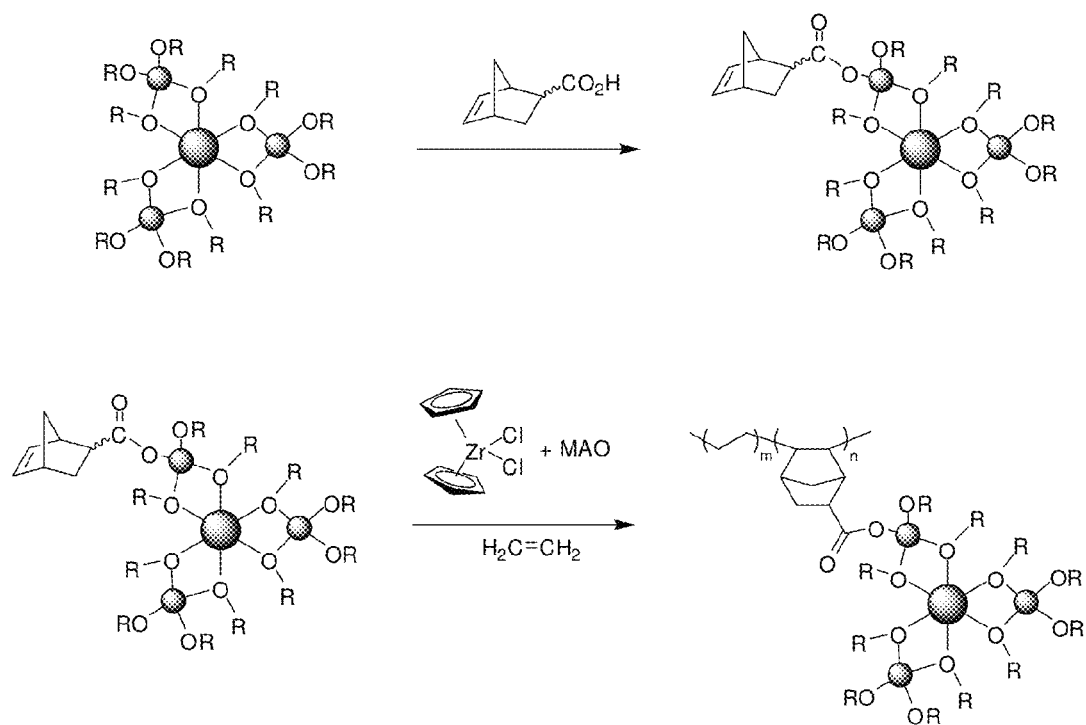
FIG. 4 schematically illustrates a method of making a RE-M nanocluster modified cyclic olefin copolymer.

Two general methods can be used for synthesis of RE-M nanocluster modified cyclic olefin copolymers. One method would be to prepare RE-modified monomers and incorporate into the copolymerization. Another option would be to carry-out polymer modification reactions. The general synthetic scheme is shown in FIG. 4. RE-M nanoclusters would be modified with norbornene ligands to yield a monofunctional monomer. This monomer would then be polymerized with ethylene using a metallocene catalyst system.

Figure 5:
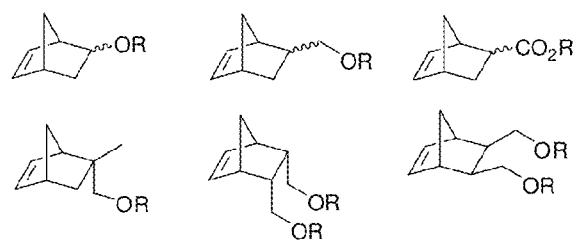
FIG. 5 shows cyclic olefins that could be used to make a RE-M nanocluster modified cyclic olefin copolymer.

Typical metallocene catalyst systems include an early transition metal (such as Zr, Ti, or Cr) and methylaluminoxane (MAO). The high oxophilicity of these early transition metal systems can cause them to be poisoned by polar functional groups. We believe that the ether-metal complex in the RE-metal modified-norbornenes may provide stabilization against catalyst poisoning. The higher reactivity and rigid structure of norbornene may also facilitate polymerization. Polyhedral oligomeric silsesquixoane (POSS)-modified norbornenes (diameter ~1.5 nm) have been successfully polymerized with ethylene using early transition metal catalysts systems. Late transition metal catalysts might also be used to catalyze the polymerization. The invention is not limited to specific COCs. For example, it is contemplated that norbornene could be substituted with a molecule as shown in FIG. 5, where R is the same or different and is an (alkyl or aralkyl) containing 10 or fewer carbon atoms Fabrication Techniques.

Two techniques of making the composite films have been demonstrated. In the first technique, an antenna ligand (such as MK) can be mixed with the RE-M nanoclusters prior to film formation. The potential disadvantage is that it may be desired to disperse the RE-M nanoclusters in a cross-linked matrix formed by UV activation of a photoinitiator in the mixture. This may cause degradation of antenna ligands such as MK. Additionally, the strong absorption of the antenna ligand may inhibit the UV-activation of the photoinitiator. We therefore demonstrated an additional technique whereby the MK was added to a preformed, crosslinked film of MP in a polymethacrylate (PMMA) matrix.

A RE-M nanocluster-PMMA film was originally formed between two sheets of glass, to prevent oxygen inhibition of the crosslinking process. The optical emission strength of the film was determined by irradiating the film at normal incidence with a 405 nm laser. The RE-M nanocluster, when excited, isotropically emits radiation at its characteristic emission wavelength. Approximately 75% of this light remains trapped in the glass, and is conveyed to the edges of the glass, where it went through a long-pass filter (to remove any scattered 405 nm light), and was captured by an integrating sphere and its intensity measured.

The diffusion of the antenna ligand into the formed film began by separating the top glass plate from the film. The emitted power from the film was then measured to verify film integrity. The MK was then diffused into the RE-M nanocluster-PMMA film by placing the MK on a small slide on a hot plate (120° C.) and covering the MK with the RE-M nanocluster-PMMA film. The film was left in contact with the MK for approximately 20 minutes, cooled, and the slide removed. A yellow color was immediately visible in the region where the MK had been in contact with the film, indicating the formation of the charge transfer complex, as neither the film nor the MK was initially colored. The optical emission from the film was measured, with the 405 nm laser impinging on the yellow region of the film. Surprisingly, the measured power at the emission wavelength was approximately 15 dB higher than before the MK was introduced. Similar experiments were also performed using N,N dimethylaniline, 4-(dimethylamine)-benzaldehyde, and 9(10H)-acridone. The benzaldehyde produced the largest enhancement of the three, with the N,N dimethylanaline showing no increase in emission. The enhancement from each of these samples was less than observed with the MK.

Previous experiences with diffusion of small molecules into crosslinked films suggest the penetration depth is often on the order of 10-20 μm, therefore, in some embodiments, preferred film thickness is about 20 μm or less, in some embodiments about 10 to 20 μm thick. A problem observed in some experiments was the slide adhering to the RE-M nanocluster-PMMA film surface after heating. Removal of the slide caused partial delamination of the film from its substrate. It should be noted, however, that the far higher net absorbance of the new compound as compared to the pure RE-M nanocluster should allow for significantly thinner films in many applications, and that this invention can mitigate some of these problems associated with the processing of thick films.

Layers of the inventive composition can be made by known methods of handling polymers including inkjet printing, screen printing, rollers, doctor blading, and other prior art techniques.

EXAMPLES

Dependence of Michler's Ketone (MK)/RE-M Nanocluster Ratio on the Sensitization

The molar ratio of MK/Eu—Al nanocluster was varied; 0.5, 1, 2, and 3. Methylmethacrylate (MMA) doped with MK/Eu—Al was coated onto a silica ($SiO_2$) substrate. The film thickness was about 400 Å. The photoluminescence spectra were obtained by exciting the film with monochromatic light at a wavelength of 430 nm. The result (see FIG. 6) revealed that the photoluminescent intensity is maximized when the MK/Eu—Al nanocluster ratio is about 2; with intensity increasing in the order 3<0.5<1<2. At the ratio of 3, the photoluminescent intensity drops significantly. It is therefore favorable to control the MK/Eu—Al nanocluster within ratios of 0.5 to less than 3 and, more preferably in the range of 1.0 to 2.5. This result is generalized to desirable ratio of antenna ligand to RE atom in a nanocluster.

Solar Cell Efficiency Measurement

Comparative Example

A mixture of MMA and diethylacetophenon (DEAP) as the photoinitiator (0.5% by weight) was coated onto single-crystalline Si (c-Si) solar cells by spin-coating at a rotation speed of 1000 rpm. The films were then polymerized by exposing to UV irradiation at an optical power of 17 mW/$cm^2$ for 2 minutes. The solar cell efficiency of the c-Si solar cells before and after coating the films were obtained using Solar Spectrum Simulator (Oriel Corporation, Model 81160) at a lamp power of 200 W and a source meter (Keithley 2400).

As a result, the change rates of the solar cell efficiency after coating compared with before coating ranges from −17% to 0%. The solar cell efficiency of some samples decreased probably because the coated films changed the reflectance of solar cells, resulting in the decrease of incident light. Therefore, it can be said that no substantial change was observed before and after the coating with a polymerized MMA film.

Solar Cell Efficiency Measurement

Embodiment 1

A mixture of MMA, Eu—Al nanocluster (5% by weight) and DEAP (0.5% by weight) (Eu—Al/MMA) was coated onto single-crystalline Si (c-Si) solar cells by spin-coating at a rotation speed of 1000 rpm and polymerized as above. As a result, the change rates of the solar cell efficiency after coating compared with before coating ranges from 0% to +14%. When comparing with the control, this indicates that the solar cell efficiency of c-Si solar cell was enhanced.

Solar Cell Efficiency Measurement

Embodiment 2

A mixture of MMA, Eu—Al nanoclusters (5% by weight), MK (molar equivalent to Eu—Al nanocluster) and DEAP (0.5% by weight) was coated onto single-crystalline Si (c-Si) solar cells by spin-coating at a rotation speed of 1000 rpm and polymerized. As a result, the change rates of the solar cell efficiency after coating compared with before coating ranges from 0% to +19%. When comparing with the previous examples, it is clear that the solar cell efficiency of c-Si solar cell was enhanced and that the enhancement rate was significantly larger than Eu—Al nanocluster alone.

Spectral Conversion

We used the Eu—Al nanocluster [Eu—Al$_3$](OAc)$_3$(O-isoBu)$_9$ as an example of the RE-M nanocluster and this nanocluster was dispersed at 5% by weight in a methyl methacrylate (MMA) solution. The procedures for the synthesis of Eu—Al nanocluster and its doping into MMA (Eu—Al/MMA) are described elsewhere. See for example H. Mataki and T. Fukui, Proc. of 2005 5$^{th}$ IEEE Conference on Nanotechnology (Nagoya, 2005), TH-A2-4, or H. Mataki et al., Jpn. J. Appl. Phys., 3, L83 (2007). To broaden the excitation wavelength range, we further added 4,4'-bis(N,N-dimethylamino) benzophenone, generally known as Michler's ketone (MK), which is known to induce a bathochromic shift of the excitation spectrum of Eu-containing organic complexes. See M. H. V. Werts et al., Chem. Commun., 1999, 799 (1999).

Figure 7:
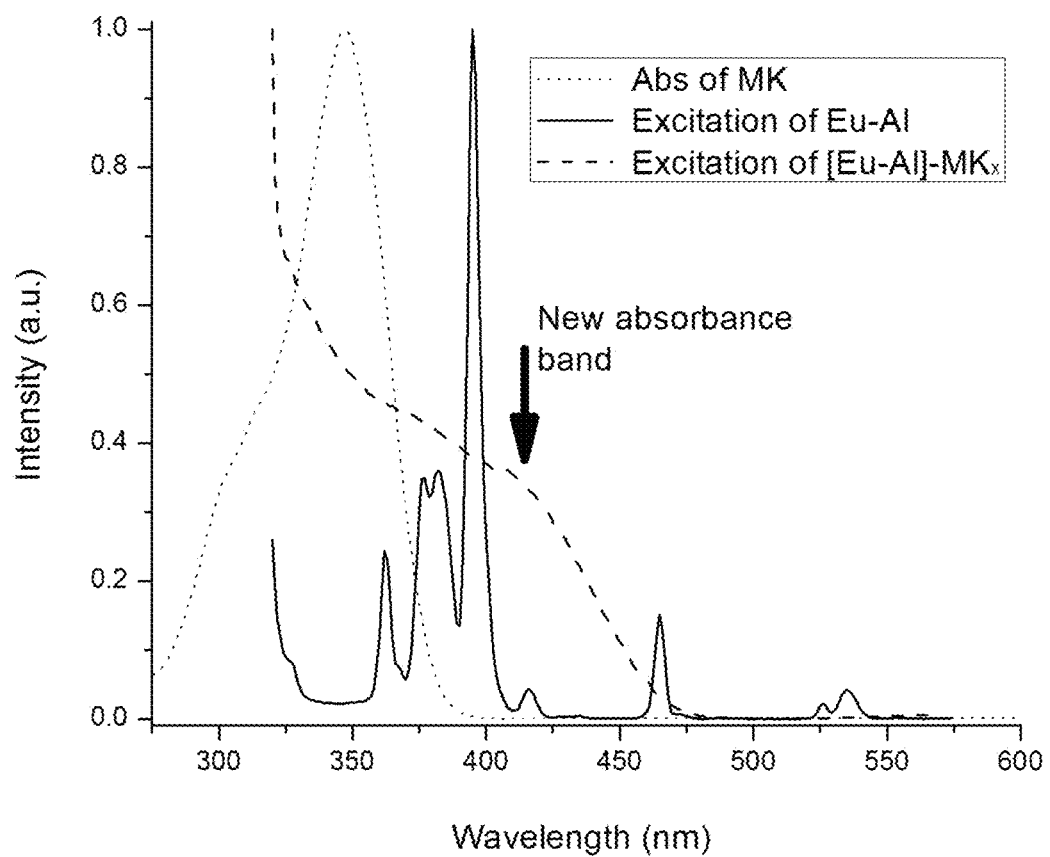
FIG. 7 shows the excitation spectra of MK, Eu—Al/MMA with MK and Eu—Al/MMA without MK, monitored at 614 nm, the typical emission wavelength of $Eu^{3+}$.

FIG. 7 shows the excitation spectra of Eu—Al/MMA with MK and without MK monitored at 614 nm, the typical emission wavelength of Eu$^{3+}$. A new, broad absorption band is observed extending to ~475 nm, imparting a slightly yellow hue to the film. Since this absorption band does not correspond to pure samples of either the RE-M nanoclusters or MK, it is reasonable to conclude that a new chemical species forms. As can be seen, the edge of excitation band for Eu—Al is extended from about 400 nm to about 470 nm by adding MK. This means that the solar radiation with wavelengths ranging from about 400 nm to 470 nm becomes usable in addition to the originally usable wavelength region less than 400 nm.

Figure 8:
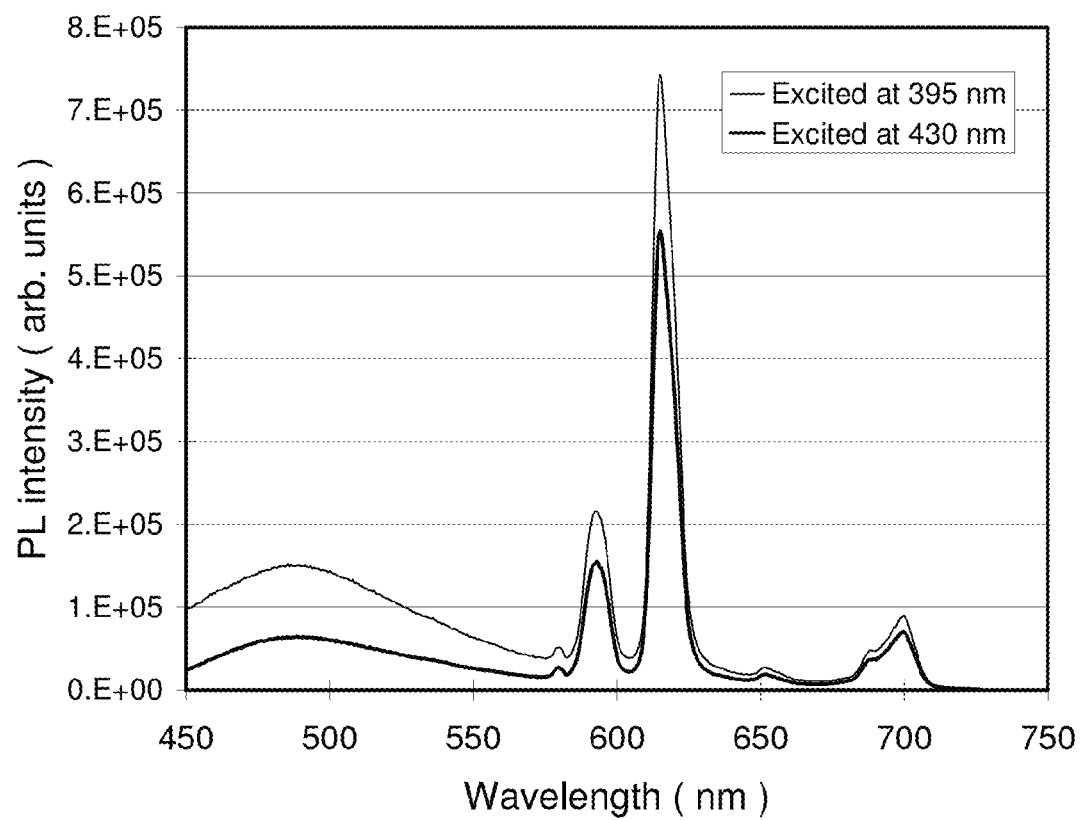
FIG. 8 shows the PL spectra of [Eu—Al]-MK/MMA excited at 395 nm and 430 nm.

FIG. 8 shows the PL spectra of [Eu—Al]-MK/MMA excited at 395 nm and 430 nm. The emission peaks at about 590 nm, 614 nm, and 700 nm are ascribed to the 4f-4f radiative transitions peculiar to Eu$^{3+}$. Because Eu$^{3+}$ cannot be excited at 430 nm, as is seen in FIG. 8, this result indicates that spectral sensitization of Eu—Al, in terms of broadening of excitation wavelength, was achieved by adding MK to Eu—Al.

The data obtained in the measurement of I-V curves carried out for Si solar cells before and after the coating of Eu—Al/MMA and [Eu—Al]-MK/MMA are summarized in Table 1. These results show that the energy conversion efficiency of a Si solar cell can be enhanced by 16.9% when coated with [Eu—Al]-MK/MMA. Also the spectral sensitization of Eu—Al using MK is quite effective for improving the SC efficiency.

TABLE 1

Characteristics of Si solar cells before and after coating of Eu—Al/MMA and [Eu—Al]-MK/MMA.

|  |  | Eu—Al/MMA | | [Eu—Al]-MK/MMA | |
|---|---|---|---|---|---|
|  |  | Before | After | Before | After |
| Voc | (V) | 0.550 | 0.540 | 0.552 | 0.541 |
| Jsc | (mA/cm2) | 25.36 | 26.74 | 24.45 | 25.60 |
| FF |  | 70.1 | 72.0 | 62.8 | 71.5 |
| Efficiency | (%) | 9.77 | 10.42 | 8.47 | 9.90 |
| Efficiency enhancement rate (%) |  | +6.7 | | +16.9 | |

The data show that the Eu—Al nanocluster spectrally sensitized by Michler's ketone can significantly enhance the energy conversion efficiency of Si solar cells. Because, unlike luminescent organic dyes, rare earth ions are effectively free from the reabsorption problem, the enhancement rate can be optimized by controlling the thickness of the spectral-conversion (SC) layer doped with RE-M nanoclusters. Also, RE-M nanoclusters do not contain double bonds and/or aromatic rings and, as a result, are expected to exhibit good stability even under UV exposure. Furthermore, when RE-M nanoclusters containing different RE ions such as green-luminescent terbium (Tb) are co-doped with Eu—Al nanoclusters, the total emission spectrum can be flexibly modified depending on spectral sensitivities peculiar to various solar cell materials.

Broad-Band Luminescence

We have synthesized various Eu-M (M=Al, Nb, Ti, Ga, Ta, Zr, Hf) nanoclusters dispersed in propylene glycol α-monomethylether of the type described in Mataki et al. WO 2006/004187 and measured the PL by exciting at 380 nm. For Eu—Ga, Eu—Ta, Eu—Hf and Eu—Zr, we observed a broadband luminescence ranging from about 400 nm to 550 nm in addition to the narrow-band luminescence peculiar to Eu$^{3+}$. On the other hand, such broad-band luminescence was not found for Eu—Al, Eu—Nb and Eu—Ti. Thus, in some preferred embodiments, the composition comprises at least one atom selected from Ga, Ta, Hf, and mixtures thereof; preferably in combination with Eu.

Surprising Results

The formation of the charge transfer complex in this instance is surprising. The RE-M nanocluster was designed to isolate the rare earth atom from the environment, to preclude quenching, and this effect has been demonstrated. The RE-M nanocluster samples used here have previously been formed into a crosslinked polymer matrix, and the processing takes place at a temperature far below Tg of the crosslinked polymer. The antenna ligands are not highly reactive, and it appears that the antenna ligands do not disrupt the RE-M nanocluster structure. Yet, we observed the formation of a charge transfer complex between the antenna ligand and the RE-M nanocluster.

The prior art also teaches that sensitizing effects are strongly dependent on distance from the lanthanide center (see Wert); therefore, it would have been unexpected for the antenna-modified RE-M nanoclusters to exhibit enhanced luminescence properties because the metal oxide (typically Al—O—) surrounding the lanthanide atoms prevent close approach of the antenna ligand to the lanthanide centers.

Without being bound by any specific theory, the results for the various antenna ligands do allow for some speculation about the important characteristics of the antenna ligands. Preferably, the antenna ligand comprises a carbonyl, as there was no enhanced response for the N,N-dimethylaniline. The much larger enhancement for the Michler's ketone sample over the acridone sample also seems to indicate that the geometry in the vicinity of the carbonyl is important. It is believed that the antenna ligand interacts with the nanoparticle without disrupting the bonding around the central lanthanide atom, and the additional degrees of rotational freedom in antenna ligands such as Michler's ketone should allow for it to more readily interact with the cluster, compared to more rigid antenna ligands such as acridone.

Investigation of the Nature of the Interaction

In the prior art, it is shown that the distance between the antenna molecule and rare earth ion is the critical factor which governs the efficiency of the sensitization. Particularly in the case of the sensitization using MK, MK is needed to be directly coordinated with Eu while keeping the distance between Eu and MK is within 2.24 Å. See M. H. V. Werts, "Luminescent Lanthanide Complex: Visible light sensitized red and near-infrared luminescence", Ph. D. thesis of University of Amsterdam, p. 105 (2000). Based on the HF and DFT (Hartree-Fock and Density-Functional-Theory) calculation, the radius of the Eu—Al nanocluster is estimated to be about 15 Å. This distance is too large for inducing the sensitization of Eu by MK. However, we discovered surprisingly that MK sensitizes Eu even after the copolymerization of Eu—Al nanoclusters with MMA. We investigated two possible pathways in which this may occur:
Pathway 1: Direct coordination of MK with Eu
Pathway 2: Cleaving the bond(s) of the ligand(s) in Eu—Al nanocluster.
Experimental Investigation for the Possibility of Pathway 1

According to the HF and FDT calculation we carried out, it is unlikely that MK forces its way through the ligands to coordinate with Eu because MK is precluded from close access to the $Eu^{3+}$ by the quasi-cage structure formed by the metal ligands. However, in case MK gets close to Eu through the ligands due to a certain mechanism, the environmental symmetry of Eu ion should be changed.

It is well known that luminescence of Eu based on $^5D_0 \rightarrow {}^7F_J$ (J=0, 1, 2, 3, 4) transitions are critically influenced by the symmetry around Eu ion, and that the difference in symmetry appears in the detailed structure of the photoluminescence (PL) spectrum. See S. Cotton, "Lanthanide and Actinide Chemistry", (John Wiley & Sons, West Sussex, 2006) and K. Matsumoto, "Chemistry of Rare Earths (in Japanese)", (Asakura Shotem, Tokyo, 2008) p. 149.

Figure 9:
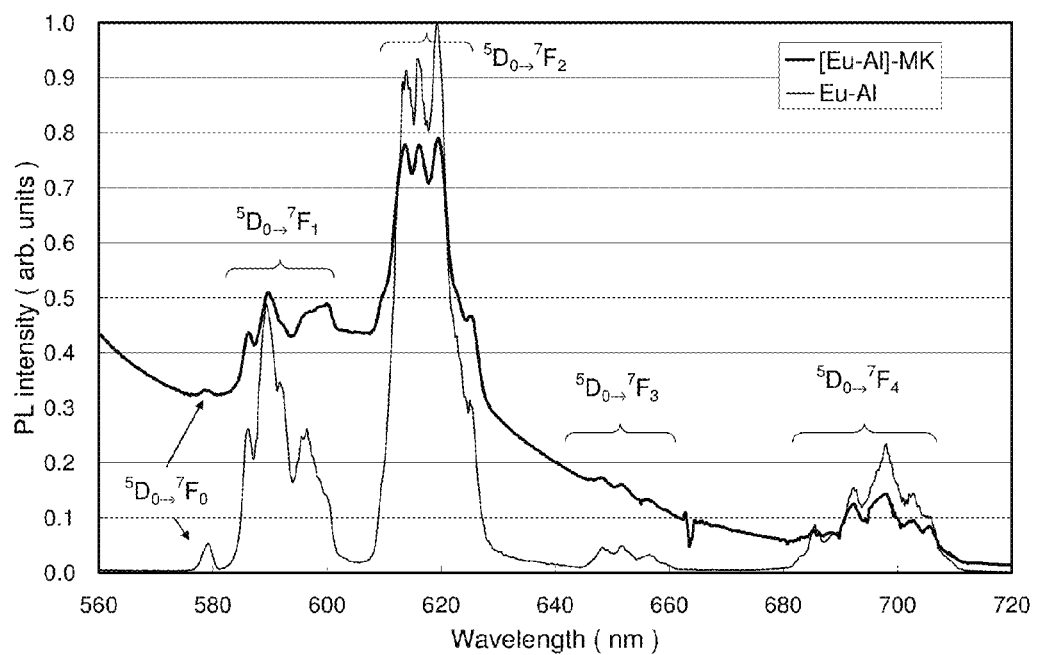
FIG. 9 shows the photoluminescence spectra of Eu—Al and [Eu—Al]-MK in PGME at 77 K.
Figure 10:
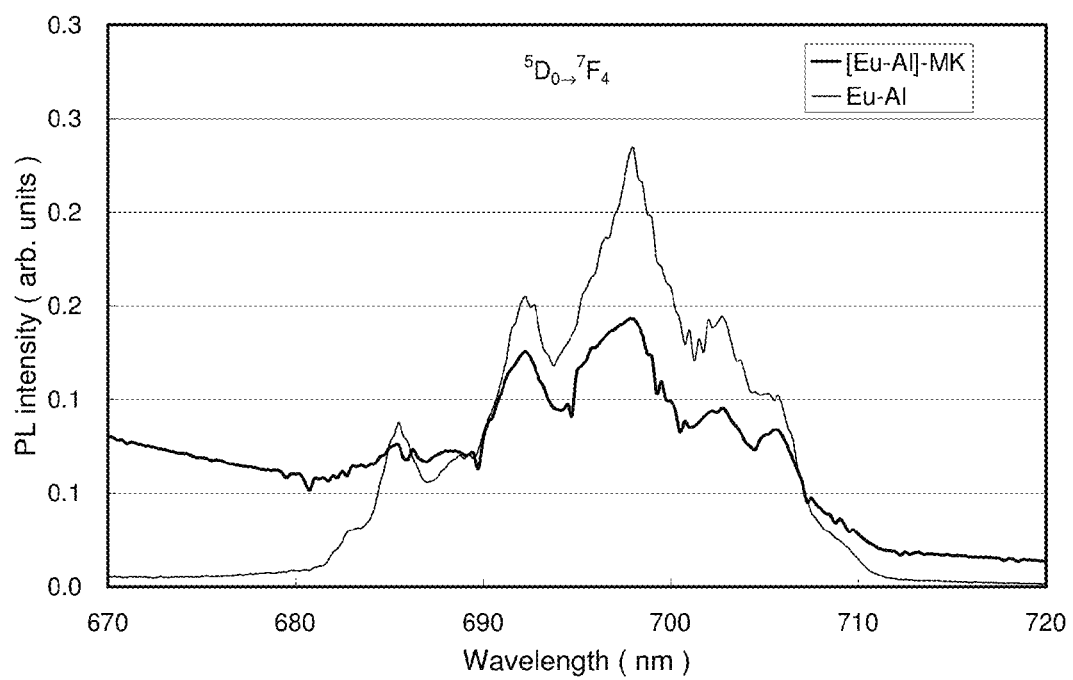
FIG. 10 shows the $^5D_0 \rightarrow ^7F_4$ region in the photoluminescence spectra of Eu—Al and [Eu—Al]-MK in PGME at 77 K.
Figure 11:
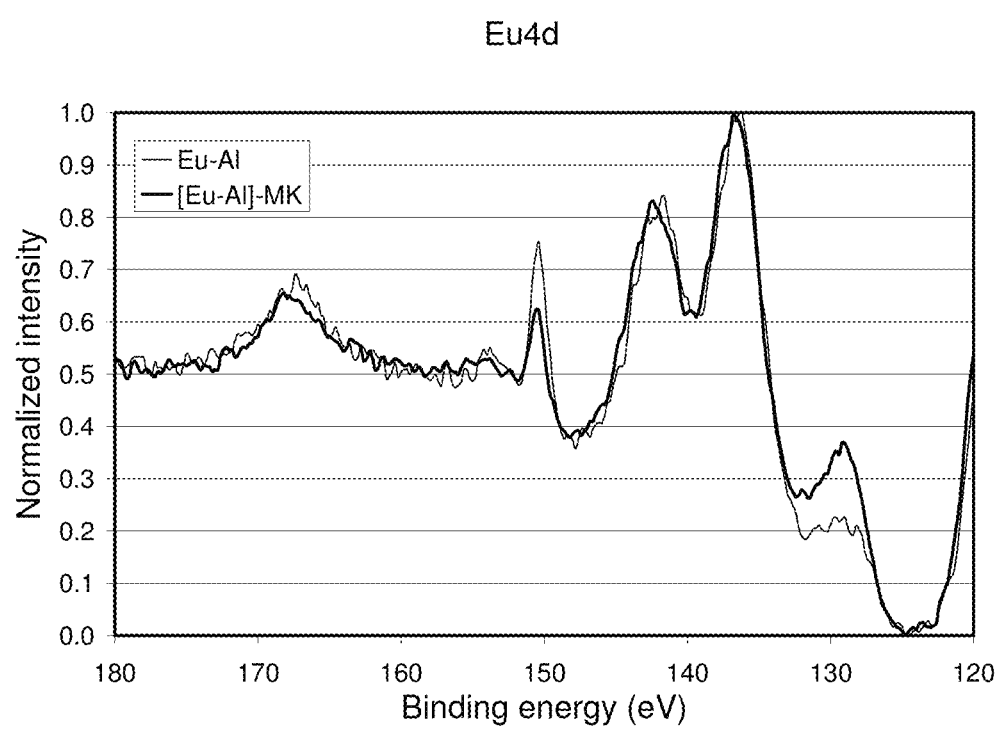
FIGS. 11-15 show XPS spectra with regard to Eu, Al, O, and C for [Eu—Al$_3$](OAc)$_3$(O-isoBu)$_9$ and [Eu—Al$_3$](OAc)$_3$ (O-isoBu)$_9$ complexed with MK.
Figure 12:
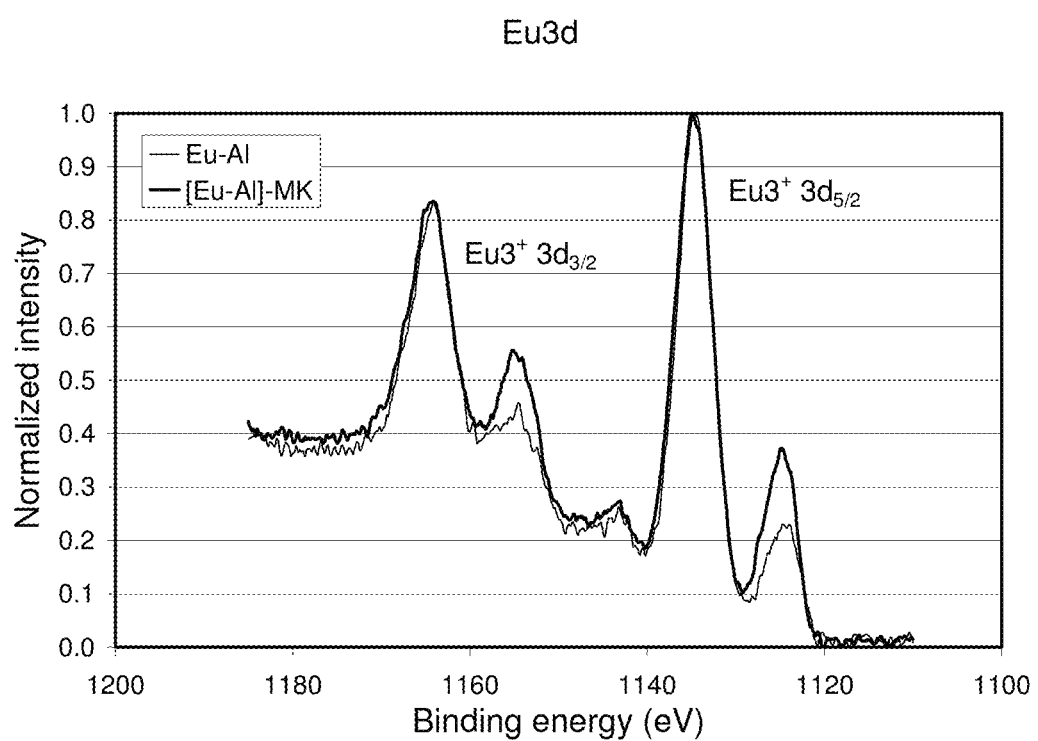
Figure 13:
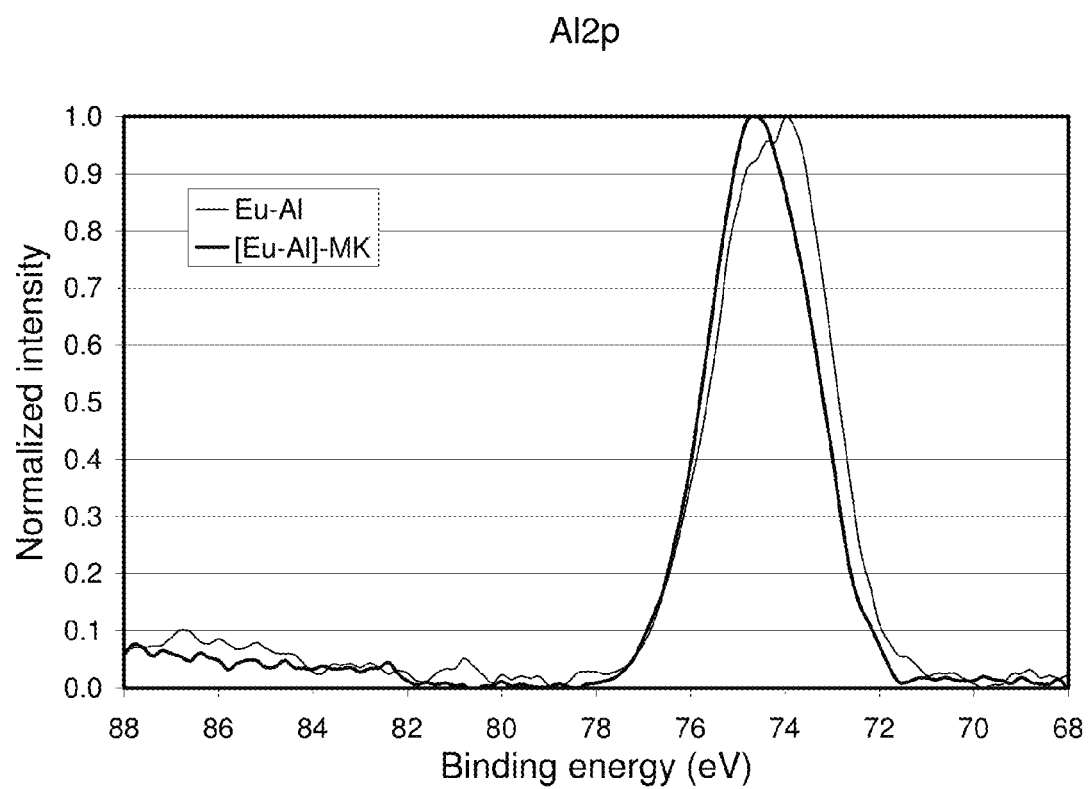
Figure 14:
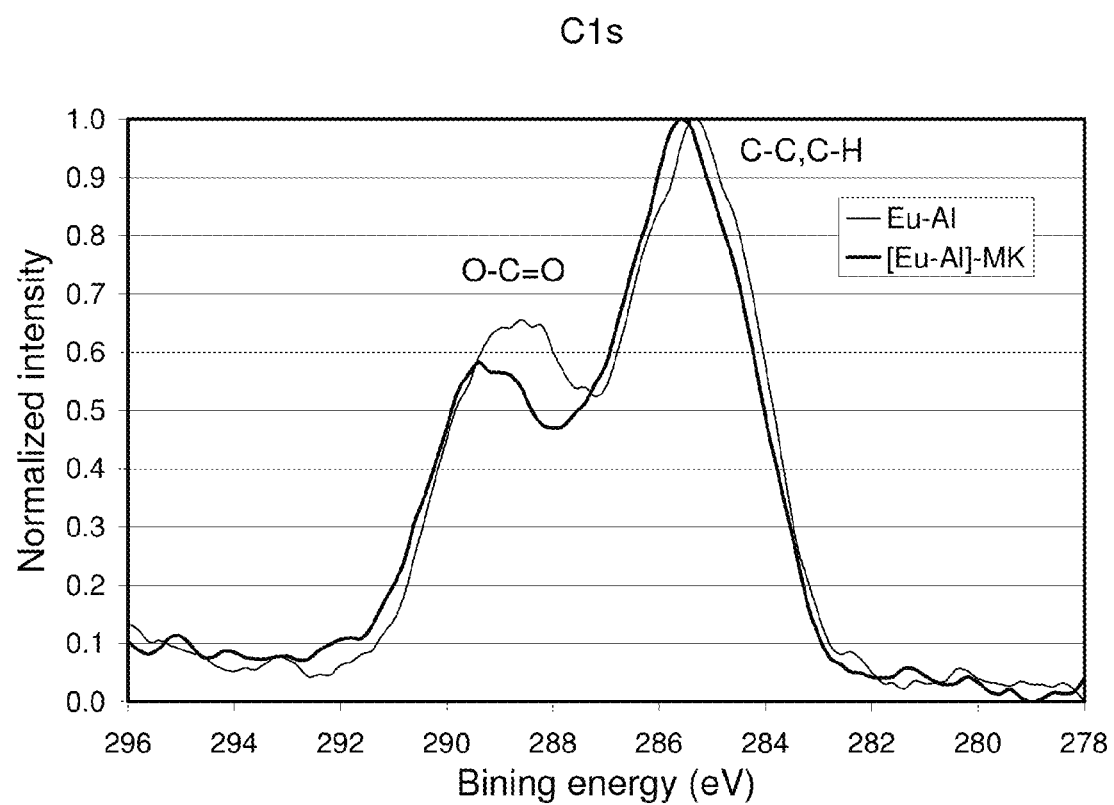
Figure 15:
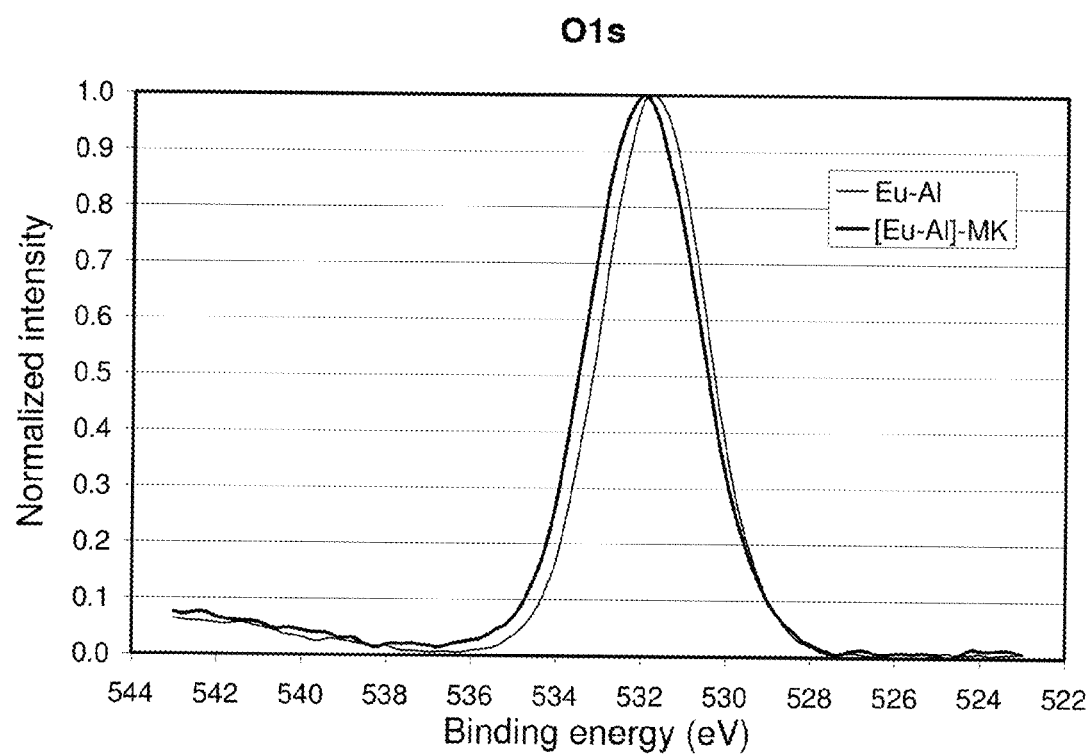

We measured the PL spectra of Eu—Al nanoclusters (Eu—Al), and Eu—Al nanoclusters mixed with MK at a mol ratio of 1:1 by exciting at 395 nm. The samples were dispersed in propyleneglycol α-monomethylether (PGME) and frozen at 77 K. The measurement result is shown in FIGS. 9 and 10. Although the PL spectrum of [Eu—Al]-MK includes the luminescence of MK itself, the luminescence ascribed to $^5D_0 \rightarrow {}^7F_J$ (J=0, 1, 2, 3, 4) transitions together with their fine structure due to the crystal-field splitting are clearly seen. And it is clearly seen that the Eu luminescence of both Eu—Al and [Eu—Al]-MK is basically the same. Particularly, the PL spectra for $^5D_0 \rightarrow {}^7F_4$ shown in FIG. 10, which is known to be most sensitive to the environmental symmetry of Eu, indicate that the symmetry of Eu—Al and [Eu—Al]-MK is the same.

These results reveal that, unlike in the case of the prior art shown by Werts et al., MK does not get close to Eu through the ligands of Eu—Al nanocluster to directly coordinate with Eu. In other words, it is verified that the sensitization of Eu by MK via pathway 1 does not occur.
Experimental Investigation for the Possibility of Pathway 2

If pathway 2 occurs, it is most probable that the Al-oxygen (O) bond is attacked and cleaved. In order to check whether the Al—O bond is cleaved, we carried out the X-ray Photoelectron Spectroscopy (XPS). Here, Eu—Al nanocluster dispersed in PGME at 5% by weight was drop cast onto a clean silicon piece. Then, PGME was evaporated at about 120° C., leaving a white powder. As for [Eu—Al]-MK, enough MK was dissolved into the 5 wt % solution of Eu—Al nanocluster in PGME to create 1:1 mol ratio of MK:Eu—Al). The [Eu—Al]-MK solution was drop cast onto a cleaned silicon wafer and PGME was driven off at about 120° C., leaving a yellowish powder, indicative of the interaction between the MK and Eu—Al nanocluster.

The XPS spectra with regard to Eu, Al, O, and C are shown in FIGS. 11-15. As seen in the data, no significant difference in the XPS spectra was observed between Eu—Al and [Eu—Al]-MK. These results indicate that the chemical bonding state of each element is basically the same. In other words, no significant change in chemical bonds, like bond cleavage, occurs when Eu—Al nanocluster is mixed with MK.
Speculation on the Mechanism of the MK Sensitization of Eu—Al Nanocluster The experimental results described above indicate that Eu of Eu—Al nanocluster is not sensitized in the manner which was described in the prior art. In order to speculate the mechanism of the MK sensitization of Eu—Al nanocluster, we attempted to observe how MK interacts with Eu—Al nanocluster by measuring the absorption spectra.

Figure 16:
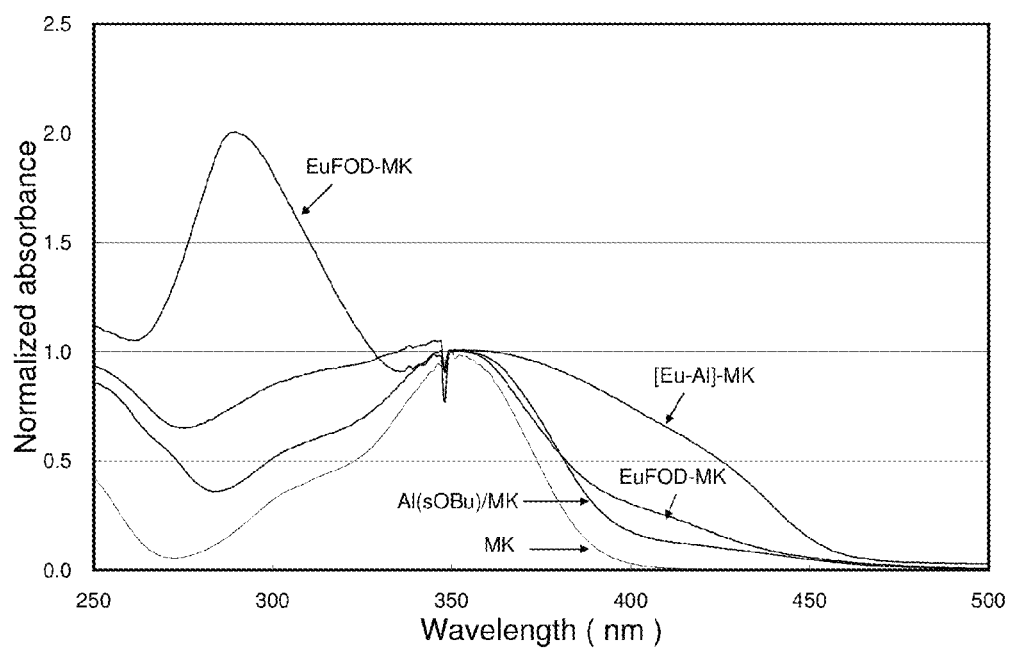
FIG. 16 shows absorption spectra of compounds mixed with MK.

FIG. 16 shows the absorption spectra of the mixtures of MK and Eu—Al; Al($^s$OBu)$_3$, the raw material for synthesizing Eu—Al nanocluster; and Eu-FOD, the β-diketonate Eu complex used in the prior art. See M. H. V. Werts et al., "Bathchromicity of Micher's ketone upon coordination with lanthanide(III) β-diketonates enables efficient sensitization of $Eu^{3+}$ for luminescence under visible light excitation", *Chem. Commun.*, 1999, pp. 799-800 (1999). The absorption spectrum of MK is also shown. Just for descriptive purpose, all the data are normalized at 350 nm, at which the excitation of MK from the ground state to the lowest excited singlet state occurs. This result indicates that charge-transfer (CT) state is formed between MK and Al(iso-OBu)$_3$. When looking at the wavelength region at around 414 nm, which corresponds to the excitation energy from the ground state to the lowest excited state of the MK-metal CT state, it is seen that the Al atom in Al($^s$OBu)$_3$ interacts with MK to form the CT state. Based on this data, we believe that MK coordinates with Al in Eu—Al nanocluster, and that the excitation energy is once transferred from MK to Al, and subsequently to Eu.

Conventionally, the excited energy is directly transferred from an antenna molecule to a rare earth ion to sensitize the rare earth ion. Particularly in the case the longer-wavelength sensitization, the direct energy transfer from an antenna molecule to a rare earth ion within a specific distance has been a key requirement. Further, the environment is required to be non-polar in the case of MK sensitization. Our finding removes such strict requirements and provides a new sensitization scheme, indirect energy transfer from an antenna molecule to rare earth ion via a transition metal or semimetal ion in the nanocluster, which enables us to sensitize rare earths with greater flexibility.

The invention claimed is:

1. A composition comprising: a polymer matrix, rare earth-metal nanoclusters dispersed in the polymer, and antenna ligands disposed on the exterior of the rare earth-metal nanoclusters; wherein the rare earth-metal nanoclusters are in the size range of 1 to 100 nm and comprise lanthanide atoms bonded to at least one semimetal or transition metal via an oxygen or sulfur atom.

2. The composition of claim 1 wherein the nanoclusters are in the size range of 1 to 10 nm.

3. The composition of claim 1 wherein the lanthanide atoms are bonded to at least one semimetal or transition metal via an oxygen atom.

4. The composition of claim 1 wherein the semimetal or transition metal comprises Zr, Ti, Ga, Al, Si, P, Hf, V, Nb, Ta, and W, and combinations thereof.

5. The composition of claim 1 wherein the lanthanide: semimetal or transition metal molar ratio is in the range of 0.25 to 0.40.

6. An optical device comprising the composition of claim 1.

7. The device of claim 6 comprising: a substrate, and a layer of the composition of claim 1.

8. The device of claim 7 further comprising a waveguide adjacent to the layer of the composition of claim 1.

9. The device of claim 8 wherein the substrate is transparent to visible light and further comprising a second substrate that is transparent to visible light, wherein the layer of the composition of claim 1 is disposed between the substrate and the second substrate.

10. The device of claim 9 wherein the substrate, second substrate, waveguide and layer of the composition of claim 1 are each substantially planar (with width and length dimensions that are each at least 10 times greater than height), the device comprising an edge parallel to height, and further comprising a photovoltaic cell disposed adjacent to the edge.

11. The device of claim 7 wherein said layer absorbs photons in a particular wavelength range and subsequently emits photons in a different wavelength range.

12. The composition of claim 1 wherein the polymer comprises a cyclic olefin copolymer (COC).

13. The composition of claim 1 possessing a broad absorption peak in the region of 375-450 nm PL spectrum and the peak is at least about 25 nm wide at half height.

* * * * *